US010805722B2

(12) United States Patent
Nakagawa et al.

(10) Patent No.: US 10,805,722 B2
(45) Date of Patent: Oct. 13, 2020

(54) ELECTROACOUSTIC TRANSDUCER AND ELECTROACOUSTIC TRANSDUCER APPARATUS

(71) Applicant: Sony Corporation, Tokyo (JP)

(72) Inventors: Toshiyuki Nakagawa, Kanagawa (JP); Yoshio Ohashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/343,543

(22) PCT Filed: Oct. 25, 2017

(86) PCT No.: PCT/JP2017/038467
§ 371 (c)(1),
(2) Date: Apr. 19, 2019

(87) PCT Pub. No.: WO2018/079583
PCT Pub. Date: May 3, 2018

(65) Prior Publication Data
US 2019/0320262 A1 Oct. 17, 2019

(30) Foreign Application Priority Data
Oct. 28, 2016 (JP) ................................ 2016-211287

(51) Int. Cl.
*H03G 11/00* (2006.01)
*H04R 3/00* (2006.01)
(Continued)

(52) U.S. Cl.
CPC ............... *H04R 3/007* (2013.01); *H04R 3/04* (2013.01); *H04R 3/12* (2013.01); *H04R 7/10* (2013.01); *H04R 17/00* (2013.01)

(58) Field of Classification Search
CPC . H04R 3/007; H04R 3/04; H04R 3/12; H04R 7/10; H04R 17/00
(Continued)

(56) References Cited

U.S. PATENT DOCUMENTS 4,440,983 A * 4/1984 Facoetti ............... H04R 17/005 381/190
2002/0027999 A1* 3/2002 Azima ................ B42D 15/022 381/431
2009/0245546 A1* 10/2009 Youn .................. H04R 17/005 381/190

FOREIGN PATENT DOCUMENTS

JP 56-103597 A 8/1981
JP 57-176799 11/1982
(Continued)

OTHER PUBLICATIONS

International Search Report and Written Opinion and English translations thereof dated Jan. 16, 2018 in connection with International Application No. PCT/JP2017/038467.
(Continued)

*Primary Examiner* — Ammar T Hamid
(74) *Attorney, Agent, or Firm* — Wolf, Greenfield & Sacks, P.C.

(57) ABSTRACT

The present technology relates to an electroacoustic transducer and an electroacoustic transducer apparatus that are compact, have good characteristics, and can retain their stable shape.
The electroacoustic transducer includes: a first sheet including a sheet-like piezoelectric material and having a curved shape; and a second sheet having substantially the same shape as the first sheet and placed on the first sheet in a layered manner. The present technology can be applied to an electroacoustic transducer.

12 Claims, 11 Drawing Sheets

(51) Int. Cl.

| | |
|---|---|
| ***H04R 3/04*** | (2006.01) |
| ***H04R 3/12*** | (2006.01) |
| ***H04R 7/10*** | (2006.01) |
| ***H04R 17/00*** | (2006.01) |

(58) Field of Classification Search
USPC ............................................................ 381/55
See application file for complete search history.

(56) References Cited

FOREIGN PATENT DOCUMENTS

| | | |
|---|---|---|
| JP | 2009-514318 A | 4/2009 |
| JP | 2015-186130 A | 10/2015 |

OTHER PUBLICATIONS

International Preliminary Report on Patentability and English translation thereof dated May 9, 2019 in connection with International Application No. PCT/JP2017/038467.

* cited by examiner

ELECTROACOUSTIC TRANSDUCER AND ELECTROACOUSTIC TRANSDUCER APPARATUS

CROSS-REFERENCE TO RELATED APPLICATIONS

This application claims the benefit under 35 U.S.C. § 371 as a U.S. National Stage Entry of International Application No. PCT/JP2017/038467, filed in the Japanese Patent Office as a Receiving Office on Oct. 25, 2017, which claims priority to Japanese Patent Application Number JP 2016-211287, filed in the Japanese Patent Office on Oct. 28, 2016, each of which is hereby incorporated by reference in its entirety.

TECHNICAL FIELD

The present technology relates to an electroacoustic transducer and an electroacoustic transducer apparatus, and more particularly to an electroacoustic transducer and an electroacoustic transducer apparatus that are compact, have good characteristics, and can retain their stable shape.

BACKGROUND ART

A speaker including driving electrodes on both surfaces of a hemispherical vibrating body is a conventional audio device including a piezoelectric material. As such a speaker, there has been proposed a piezoelectric speaker in which a piezoelectric polymer film has a curved structure in which the top portion bulges more than the periphery, and electrodes are formed on both front and back surfaces of the piezoelectric polymer film (see, for example, Patent Document 1).

In addition, in order to ensure good reproduction frequency characteristics over a wide frequency band, a hybrid speaker that combines a dynamic speaker and a piezoelectric speaker has also been proposed (see, for example, Patent Document 2).

CITATION LIST

Patent Document

Patent Document 1: Japanese Patent Application Laid-Open No. S59-158199

Patent Document 2: Japanese Patent Application Laid-Open No. 2004-147077

SUMMARY OF THE INVENTION

Problems to be Solved by the Invention

However, it is difficult for the above-described technology to obtain a speaker that is compact, has good characteristics, and has a stable shape.

For example, in the piezoelectric speaker described in Patent Document 1, since the piezoelectric polymer film as the film material is soft, the shape of the piezoelectric polymer film is unstable. Therefore, the piezoelectric speaker as a product can easily be disfigured by being depressed by use operation, for example.

In addition, since the hybrid speaker described in Patent Document 2 includes a dynamic speaker, it is difficult to make a thin speaker, which is one of the advantages of piezoelectric speakers.

The present technology has been made in view of such a situation, and an object thereof is to achieve compactness, good characteristics, and retention of the stable shape.

Solutions to Problems

An electroacoustic transducer according to a first aspect of the present technology includes: a first sheet including a sheet-like piezoelectric material and having a curved shape; and a second sheet having substantially the same shape as the first sheet and placed on the first sheet in a layered manner.

The second sheet can be a nonwoven fabric.

The electroacoustic transducer can further include a third sheet including a sheet-like piezoelectric material, having substantially the same shape as the first sheet, and placed in a layered manner on an opposite side of the second sheet that is not in contact with the first sheet.

The second sheet can be a piezoelectric material.

The second sheet can be bonded to the first sheet.

The first sheet and the second sheet can be fixed by sandwiching and pressing a press portion provided at an end portion of the first sheet and the second sheet between a frame fixing member and a frame base.

The frame fixing member and the frame base can include opening portions for exposing the first sheet and the second sheet.

A tapered portion can be formed on at least one of the frame fixing member or the frame base such that the opening portion has varying widths in a first direction in which the frame fixing member and the frame base are aligned when viewed from a second direction substantially perpendicular to the first direction.

The tapered portion can be formed such that the opening portion becomes wider toward a position farthest from the first sheet and the second sheet in the first direction.

The tapered portion can be formed such that the opening portion becomes narrower toward a position farthest from the first sheet and the second sheet in the first direction.

According to the first aspect of the present technology, an electroacoustic transducer includes: a first sheet including a sheet-like piezoelectric material and having a curved shape; and a second sheet having substantially the same shape as the first sheet and placed on the first sheet in a layered manner.

An electroacoustic transducer apparatus according to a second aspect of the present technology includes: a first electroacoustic transducer having: a first sheet including a sheet-like piezoelectric material and having a curved shape; and a second sheet having substantially the same shape as the first sheet and placed on the first sheet in a layered manner; and a second electroacoustic transducer connected in parallel to the first electroacoustic transducer and including a first sheet and a second sheet having an area different from an area of the first sheet and the second sheet of the first electroacoustic transducer.

The first electroacoustic transducer or the second electroacoustic transducer can be a low-frequency electroacoustic transducer, and a protection adjustment unit can be connected to the low-frequency electroacoustic transducer to protect the low-frequency electroacoustic transducer and adjust frequency characteristics.

The protection adjustment unit can be a protection resistor or a low-pass filter.

According to the second aspect of the present technology, an electroacoustic transducer apparatus includes: a first electroacoustic transducer having: a first sheet including a sheet-like piezoelectric material and having a curved shape; and a second sheet having substantially the same shape as the first sheet and placed on the first sheet in a layered manner; and a second electroacoustic transducer connected in parallel to the first electroacoustic transducer and including a first sheet and a second sheet having an area different from an area of the first sheet and the second sheet of the first electroacoustic transducer.

Effects of the Invention

According to the first and second aspects of the present technology, it is possible to achieve compactness, good characteristics, and retention of the stable shape.

Note that the effects described herein are not necessarily limitations, and any of the effects described in the present disclosure may be obtained.

MODE FOR CARRYING OUT THE INVENTION

Hereinafter, embodiments to which the present technology is applied will be described with reference to the drawings.

First Embodiment

Configuration Example of Piezoelectric Audio Device

According to the present technology, a curved acoustic sheet obtained by curving a sheet-like piezoelectric device and a reinforcing sheet having substantially the same shape as the curved acoustic sheet are placed in a layered manner to form an electroacoustic transducer that is compact, has good characteristics, and can retain its stable shape.

Hereinafter, piezoelectric audio devices and a piezoelectric audio apparatus will be described as examples of embodiments to which the present technology is applied. However, these embodiments are exemplary embodiments adopted on the basis of the present technology, and the present technology is not to be construed in a limited way on the basis of matters specific to these embodiments.

Figure 1:
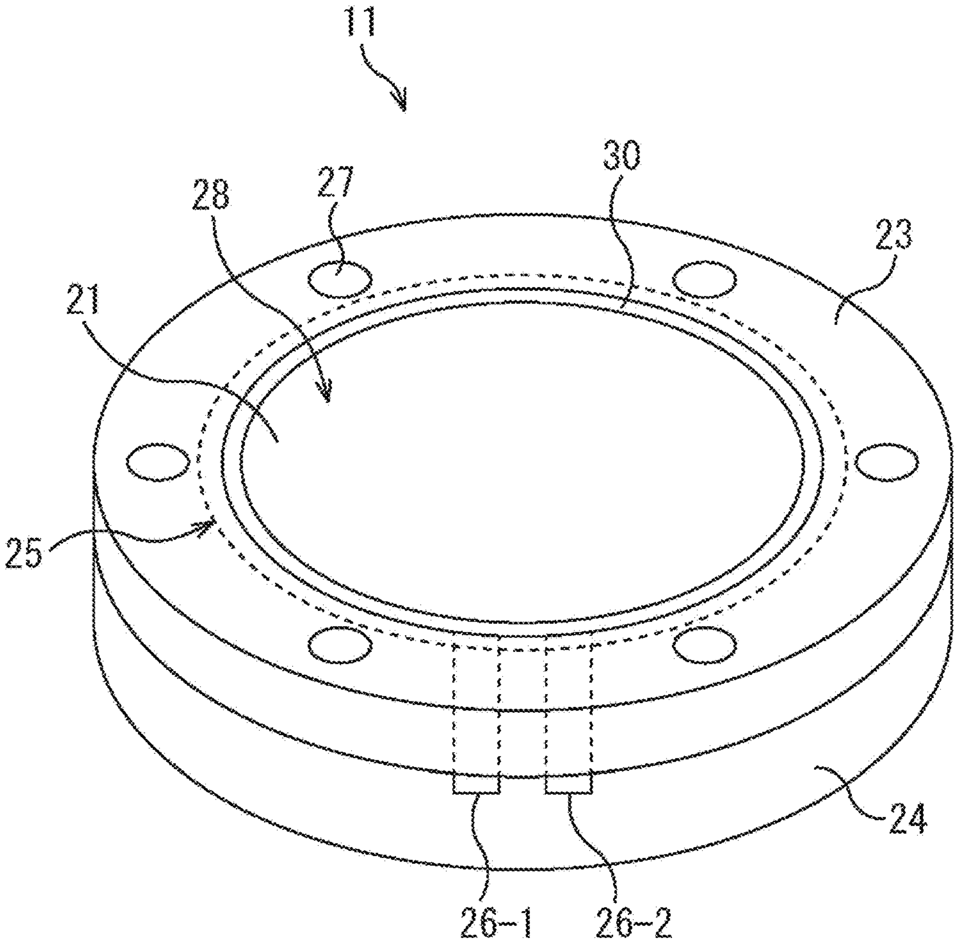
FIG. 1 is a perspective view illustrating a configuration example of an appearance of a piezoelectric audio device.
Figure 2:
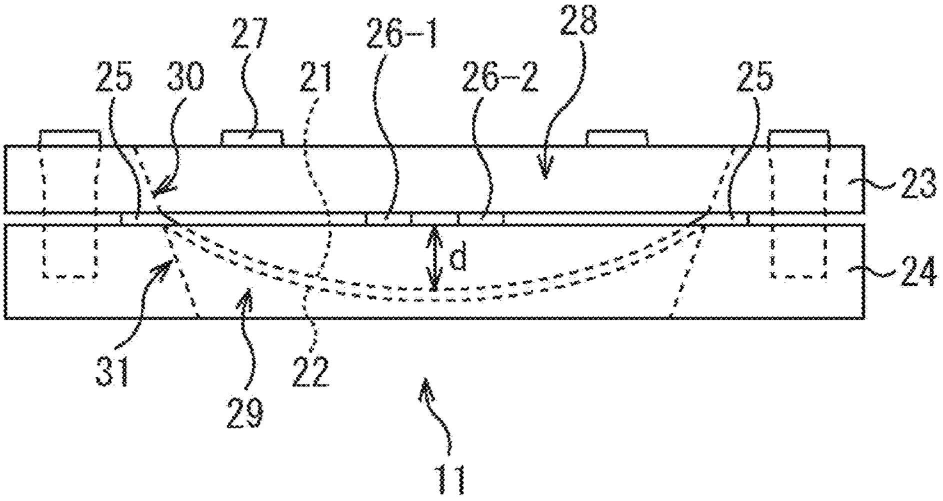
FIG. 2 is a side view illustrating a configuration example of an appearance of the piezoelectric audio device.

FIGS. 1 and 2 are diagrams illustrating a configuration example of an appearance of a piezoelectric audio device to which the present technology is applied. Specifically, FIG. 1 is a perspective view of a piezoelectric audio device to which the present technology is applied, and FIG. 2 is a side view of the piezoelectric audio device to which the present technology is applied. Note that, in FIGS. 1 and 2, components corresponding to each other are denoted by the same reference signs, and the description thereof is appropriately omitted.

First, with reference to FIGS. 1 and 2, a piezoelectric audio device to which the present technology is applied will be described. The piezoelectric audio device 11 illustrated in FIGS. 1 and 2 is a speaker unit, i.e., an electroacoustic transducer which vibrates according to an electric signal as an input acoustic signal and converts the acoustic signal into sound.

The piezoelectric audio device 11 has a curved acoustic sheet 21, a reinforcing sheet 22, a frame ring 23, and a frame base 24.

In this example, the curved acoustic sheet 21 is exposed on the upper side in FIG. 1, that is, on the side including the frame ring 23. When the side including the frame ring 23 reproduces sound, the sound is radiated by the piezoelectric audio device 11. Hereinafter, the surface of the piezoelectric audio device 11 where sound is radiated, that is, the exposed surface of the curved acoustic sheet 21, is also referred to as a radiation surface in particular.

In addition, in the piezoelectric audio device 11, the reinforcing sheet 22 is exposed when viewed from the lower side in FIG. 2, that is, through the frame base 24. The exposed surface of the reinforcing sheet 22 is opposite to the radiation surface, that is, the opposite surface of the radiation surface.

The curved acoustic sheet 21 is obtained, for example, by using a sheet-like piezoelectric device having an acoustic effect as a material and curving the piezoelectric device by molding such that a part of the piezoelectric device has a three-dimensional shape with a depth d. In other words, the curved acoustic sheet 21 is the curved portion, that is, the three-dimensional portion, of the molded piezoelectric device. In addition, the piezoelectric device constituting the curved acoustic sheet 21 includes sheet-like electrodes on both surfaces of a sheet-like piezoelectric material. Further, the piezoelectric device is provided with cover layers for protecting the electrodes as necessary.

In this example, when viewed from the radiation surface side, the curved acoustic sheet 21 of the piezoelectric audio device 11 has a concave shape protruding on the opposite side of the radiation surface side. Specifically, the curved acoustic sheet 21 has a spherical crown shape with a depth d obtained by cutting the sphere having a radius r along a plane.

Here, for example, the depth d is about 5 mm. For example, if the depth d of the spherical crown shape of the curved acoustic sheet 21 is reduced, the frequency characteristics of the low frequency portion of the piezoelectric audio device 11 can be improved. In addition, the directivity of the sound to be reproduced by the piezoelectric audio device 11 can be adjusted, for example, by the curvature of the shape of the curved acoustic sheet 21.

In addition, for example, the piezoelectric material constituting the curved acoustic sheet 21 is a sheet-like flexible polymer composite piezoelectric body or the like in which polymeric ceramics are dispersed. Such a piezoelectric material expands or contacts according to the polarity when a voltage is applied, so that acoustic conversion can be realized by curving (vibrating) the curved acoustic sheet 21 using expansion and contraction of the piezoelectric material.

The property of converting electric energy and mechanical energy is called the piezoelectric effect. In order to obtain the piezoelectric effect, it is necessary to perform polarization treatment on the piezoelectric material in advance. Polarization treatment is a process of applying a DC high voltage to ceramics at a high temperature, for example, to align spontaneous polarization directions and give polarity.

The following description is based on the premise that the curved acoustic sheet 21 and other curved acoustic sheets (described later) are subjected to polarization treatment in advance. For example, the curved acoustic sheet 21 is subjected to polarization treatment before molding is performed.

The reinforcing sheet 22 is obtained by curving a sheet-like member by molding such that a part of the sheet-like member has substantially the same shape as the curved acoustic sheet 21. In other words, the reinforcing sheet 22 is the curved portion, that is, the three-dimensional portion, of the molded member.

Therefore, the reinforcing sheet 22 also has a concave shape, specifically, a spherical crown shape with a depth d obtained by cutting the sphere having a radius r along a plane, for example.

The reinforcing sheet 22 includes a material different from the piezoelectric device and having no acoustic effect, for example. More specifically, for example, the reinforcing sheet 22 includes a nonwoven fabric or the like. Note that the following description is based on the premise that the reinforcing sheet 22 includes a nonwoven fabric.

For example, in the piezoelectric audio device 11, the reinforcing sheet 22 is placed in a layered manner on the surface of the curved acoustic sheet 21 opposite to the radiation surface and bonded to the curved acoustic sheet 21 with an adhesive or the like.

By placing the reinforcing sheet 22 on the curved acoustic sheet 21 in a layered manner in this way, the hardness of the curved surface including the curved acoustic sheet 21 and the reinforcing sheet 22 can be freely controlled in a desired manner. Therefore, sound pressure loss can be controlled. Specifically, for example, peaks and dips in the frequency characteristics of the piezoelectric audio device 11 can be reduced.

Further, in the piezoelectric audio device 11, since the curved acoustic sheet 21 including a piezoelectric material is vibrated to output sound, it is possible to ensure good reproduction frequency characteristics over a wide frequency band with the compact, that is, thin, piezoelectric audio device 11. In particular, by placing the reinforcing sheet 22 on the curved acoustic sheet 21 in a layered manner, it is possible not only to stabilize the shape but also to obtain better frequency characteristics than in a case where only the curved acoustic sheet 21 is used.

In addition, the curved acoustic sheet 21 and the reinforcing sheet 22 are provided with a substantially ring-shaped press portion 25 integrally formed therewith.

In other words, the press portion 25 is the portion of the molded piezoelectric device that does not serve as the curved acoustic sheet 21 and the portion of the molded nonwoven fabric that does not serve as the reinforcing sheet 22. Therefore, in this example, the press portion 25 is integrally, that is, continuously, formed with the curved acoustic sheet 21 and the reinforcing sheet 22 along the end portion of the curved acoustic sheet 21 and the reinforcing sheet 22.

For example, at the time of manufacturing the piezoelectric audio device 11, a sheet-like piezoelectric device and a nonwoven fabric are placed in a layered manner and bonded with an adhesive or the like, and the piezoelectric device and the nonwoven fabric are simultaneously molded into the curved acoustic sheet 21, the reinforcing sheet 22, and the press portion 25.

Note that in order to mold a sheet-like piezoelectric device for the curved acoustic sheet 21 and a sheet-like nonwoven fabric for the reinforcing sheet 22, a process for bonding the piezoelectric device and the nonwoven fabric is required. Thus, for example, during the molding process, an adhesive is applied to either the piezoelectric device or the nonwoven fabric or both the piezoelectric device and the nonwoven fabric. Alternatively, for example, a thermoplastic adhesive may be applied to the nonwoven fabric so that the nonwoven fabric can be bonded to the curved acoustic sheet 21 in the molding process.

The method of molding the curved acoustic sheet 21 and the reinforcing sheet 22 may be any method such as pneumatic molding, press molding, and vacuum molding, for example. A plurality of molding methods may be combined for molding the curved acoustic sheet 21 and the reinforcing sheet 22.

In addition, although the curved acoustic sheet 21 is arranged on the radiation surface side and the reinforcing sheet 22 is arranged on the side of the curved acoustic sheet 21 opposite to the radiation surface side in this example, the reinforcing sheet 22 may be arranged on the radiation surface side and the curved acoustic sheet 21 may be arranged on the side of the reinforcing sheet 22 opposite to the radiation surface side. Even in such a case, an adhesive may be applied to at least one of the piezoelectric device or the nonwoven fabric.

The curved acoustic sheet 21 is connected to an electrode portion 26-1 and an electrode portion 26-2 for pulling out electrodes.

For example, the electrode portion 26-1 is connected to an electrode provided on the radiation surface side of the piezoelectric device constituting the curved acoustic sheet 21, and the electrode portion 26-2 is connected to an electrode provided on the side of the piezoelectric device constituting the curved acoustic sheet 21 opposite to the radiation surface side. These electrode portions 26-1 and 26-2 are connected to an amplifier via acoustic signal lines, for example.

By providing the electrode portion 26-1 and the electrode portion 26-2 in this way, the piezoelectric audio device 11 and a reproduction control device can be easily connected. Note that, in the following description, the electrode portion 26-1 and the electrode portion 26-2 are also simply referred to as the electrode portion(s) 26 unless it is necessary to distinguish them.

Note that although the two electrode portions 26 are arranged adjacent to each other in this case, these electrode portions 26 can be arranged at freely-determined positions such as separate positions, e.g., left and right ends, and the like. The same applies to the electrode portions connected to the curved acoustic sheets which will be described later.

The frame ring 23 and the frame base 24 each include a ring-shaped member whose central portion is hollowed out in a circular shape. The curved acoustic sheet 21 and the reinforcing sheet 22 are fixed by the frame rings 23 and the frame base 24.

In other words, in the piezoelectric audio device 11, the press portion 25 and the electrode portion 26 are sandwiched between the frame ring 23 and the frame base 24. Then, the frame ring 23 is pressed against the frame base 24 by a stopper 27, whereby the curved acoustic sheet 21 and the reinforcing sheet 22 are fixed to the frame base 24.

Note that the press portion 25 may have any width that allows the curved acoustic sheet 21 and the reinforcing sheet 22 to be suitably pressed. However, if the width of the press portion 25, that is, the area of the press portion 25, is set to the minimum necessary width/area, for example, it is possible to suppress the influence caused by the reduction in the impedance of the piezoelectric audio device 11 during the reproduction in a super high frequency band.

Alternatively, for example, the width of the press portion 25 may be increased so that the entire surface of the frame base 24 in contact with the frame ring 23 is covered with the press portion 25.

By fixing the press portion 25 with the frame ring 23 and the frame base 24 in this manner, it is possible to more stably retain the shape of the molded curved acoustic sheet 21 and reinforcing sheet 22. Note that the fixing member for fixing the curved acoustic sheet 21 and the reinforcing sheet 22 is not limited to the circular member represented by the frame ring 23 and the frame base 24. Any member such as a rectangular frame member may be used as the fixing member.

In addition, as illustrated in FIG. 1, the hollowed-out portion at the center of the frame ring 23 is an opening portion 28 for exposing the entire curved acoustic sheet 21 on the radiation surface side. The lateral width of the opening portion 28 in FIG. 1 is formed to be equal to or greater than the lateral width of the curved acoustic sheet 21 in the drawing.

Similarly, as illustrated in FIG. 2, the hollowed-out portion at the center of the frame base 24 is an opening portion 29 for exposing the entire reinforcing sheet 22 on the opposite side of the radiation surface side. The lateral width of the opening portion 29 in FIG. 2 is formed to be substantially equal to the lateral width of the reinforcing sheet 22 in FIG. 2.

Further, the frame ring 23 and the frame base 24 are provided with tapered portions for adjusting the frequency characteristics of the piezoelectric audio device 11.

Specifically, for example, as illustrated in FIG. 1, a tapered portion 30 is formed at the edge portion of the frame ring 23. In addition, as illustrated in FIG. 2, a tapered portion 31 is formed at the edge portion of the frame base 24.

These tapered portions 30 and 31 can control the frequency characteristics, i.e., the influence on the audio (sound) emitted from the curved acoustic sheet 21 or the like fixed by the frame ring 23 and the frame base 24.

For example, the tapered portion 30 is formed at a portion of the frame ring 23 in the vicinity of the curved acoustic sheet 21 along the inner edge of the frame ring 23.

Then, the tapered portion 30 is formed such that the opening portion 28 has varying lateral (in FIG. 2) widths in the vertical direction in FIG. 2 when the frame ring 23 is viewed in the direction into the page in FIG. 2, that is, when the frame ring 23 is viewed in the direction substantially perpendicular to the direction in which the frame ring 23 and the frame base 24 are aligned.

In particular, here in FIG. 2, the tapered portion 30 is formed such that the opening portion 28 becomes wider in the lateral direction in FIG. 2 toward the position farthest from the curved acoustic sheet 21 in the vertical direction.

In other words, the inner diameter of the frame ring 23 is smallest at the position adjacent to the frame base 24, and the inner diameter of the frame ring 23 becomes larger in the direction away from the frame base 24. Hereinafter, a tapered structure in which the width of the opening portion becomes smaller (narrower) toward the curved acoustic sheet 21 and the reinforcing sheet 22 is also referred to as a forward tapered structure.

On the other hand, as illustrated in FIG. 2, the tapered portion 31 is formed at a portion of the frame base 24 in the vicinity of the reinforcing sheet 22 along the inner edge of the frame base 24.

The tapered portion 31 is formed such that the opening portion 29 has varying lateral (in FIG. 2) widths in the vertical direction in FIG. 2 when the frame base 24 is viewed in the direction into the page in FIG. 2, that is, when the frame base 24 is viewed in the direction substantially perpendicular to the direction in which the frame ring 23 and the frame base 24 are aligned.

In particular, here in FIG. 2, the tapered portion 31 is formed such that the opening portion 29 becomes narrower in the lateral direction in FIG. 2 toward the position farthest from the reinforcing sheet 22 in the vertical direction.

In other words, the inner diameter of the frame base 24 is largest at the position adjacent to the frame ring 23, and the inner diameter of the frame base 24 becomes smaller in the direction away from the frame ring 23. Hereinafter, a tapered structure in which the width of the opening portion becomes larger (wider) toward the curved acoustic sheet 21 and the reinforcing sheet 22 is also referred to as a reverse tapered structure.

By forming tapered portions on the frame ring 23 and the frame base 24 to create tapered structures in this manner, the degree of exposure of the surfaces of the curved acoustic sheet 21 and the reinforcing sheet 22 to air can be adjusted. Thus, desired frequency characteristics can be obtained.

Note that the tapered portions 30 and 31 may have any structure as long as the press portion 25 can be pressed by the frame ring 23 and the frame base 24.

In addition, although this example provides a configuration in which tapered portions are provided on both the frame ring 23 and the frame base 24, a tapered portion may be provided only on the frame ring 23 or only on the frame base 24, or no tapered portion may be provided on either the frame ring 23 or the frame base 24.

Further, the tapered structures of the tapered portions 30 and 31 may be either a forward tapered structure or a reverse tapered structure. Good frequency characteristics can be obtained especially with the tapered portion 30 having a forward tapered structure and the tapered portion 31 having a reverse tapered structure. In this case, a part of the press portion 25 may not be pressed by the frame ring 23 and the frame base 24.

The above-described piezoelectric audio device 11 operates in response to an electric signal as an acoustic signal being supplied from the electrode portion 26, and outputs the sound corresponding to the acoustic signal. Specifically, in response to an acoustic signal being supplied, the curved acoustic sheet 21 vibrates in accordance with the acoustic signal, whereby the sound is reproduced.

Here, the sensitivity of the piezoelectric audio device 11 to sound pressure in a case where a flexible piezoelectric material is used as a material constituting the curved acoustic sheet 21 will be described.

By performing molding, the curved acoustic sheet 21 has a rounded shape, and the sound pressure sensitivity of the piezoelectric audio device 11 having the piezoelectric effect is exclusively related to the area and thickness of the curved acoustic sheet 21.

Specifically, according to the formula of the capacitance C of a general capacitor, the sensitivity can be improved as the area of the curved acoustic sheet 21 increases and as the thickness of the curved acoustic sheet 21 decreases. In other words, a larger sound pressure can be obtained with the same voltage.

For example, both increasing the area of the curved acoustic sheet 21 and reducing the thickness of the curved acoustic sheet 21 in order to improve the sensitivity of the piezoelectric audio device 11 to obtain a desired sound pressure deteriorate the stability of the shape of the curved acoustic sheet 21.

Therefore, in the piezoelectric audio device 11, for example, the reinforcing sheet 22 includes a material different from the material for the curved acoustic sheet 21, such as a nonwoven fabric having no acoustic effect, and the curved acoustic sheet 21 and the reinforcing sheet 22 are placed in a layered manner. This makes it possible to enhance the power for retaining the shape of the molded curved acoustic sheet 21 while improving the sensitivity of the piezoelectric audio device 11. In addition, without using a dynamic speaker or the like, it is possible to obtain the piezoelectric audio device 11 that is compact, or thin, and has good frequency characteristics.

As described above, in the piezoelectric audio device 11, by placing the curved acoustic sheet 21 including a piezoelectric material and the reinforcing sheet 22 including a nonwoven fabric in a layered manner, it is possible to obtain an electroacoustic transducer that is compact, has good frequency characteristics, and has a stable shape.

First Modification of First Embodiment

Configuration Example of Piezoelectric Audio Device

Figure 3:
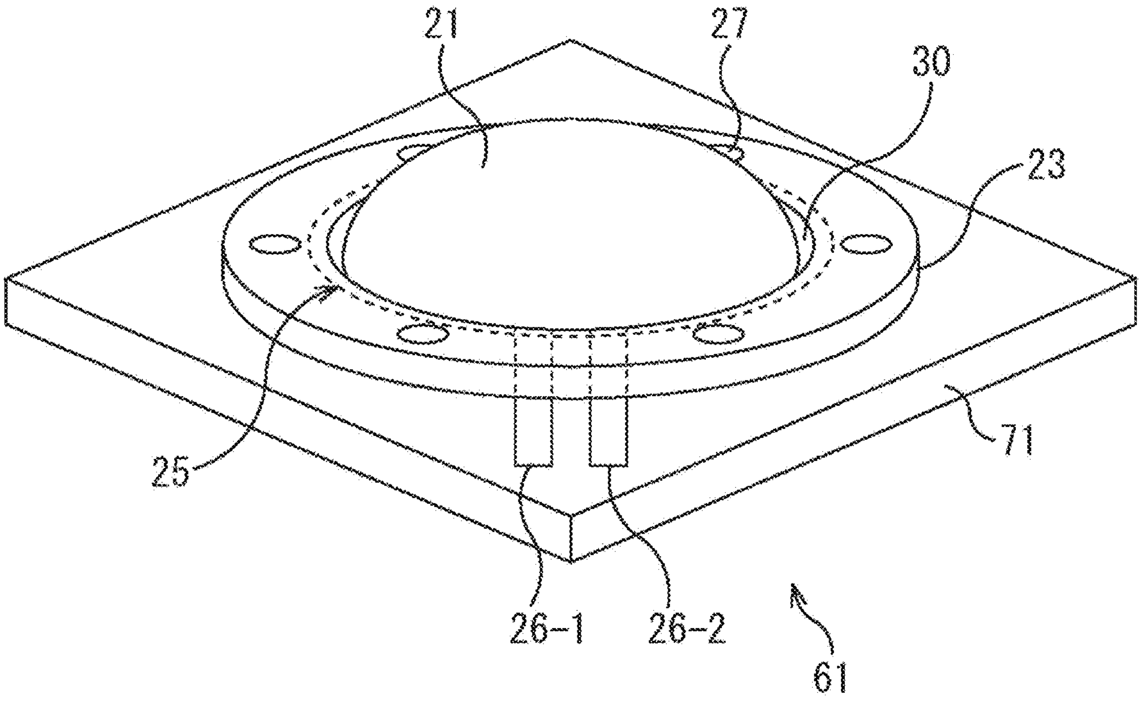
FIG. 3 is a perspective view illustrating another configuration example of an appearance of a piezoelectric audio device.

Note that the above description is an example in which the curved acoustic sheet 21 and the reinforcing sheet 22 have a concave shape protruding on the opposite side of the radiation surface side. However, the curved acoustic sheet 21 and the reinforcing sheet 22 may have a convex shape protruding on the radiation surface side as illustrated in FIG. 3, for example. Note that, in FIG. 3, components corresponding to those in FIG. 1 are denoted by the same reference signs, and the description thereof is appropriately omitted.

FIG. 3 is a perspective view illustrating another configuration example of a piezoelectric audio device to which the present technology is applied. The piezoelectric audio device 61 illustrated in FIG. 3 has the curved acoustic sheet 21, the reinforcing sheet 22, the frame ring 23, and a frame base 71. Note that since the reinforcing sheet 22 is in contact with the curved acoustic sheet 21 on the lower side in the drawing, the reinforcing sheet 22 is hidden behind the curved acoustic sheet 21 and cannot be seen in FIG. 3.

The upper side of the piezoelectric audio device 61 in the drawing is the radiation surface side. The press portion 25 provided at the end portion of the curved acoustic sheet 21 and the reinforcing sheet 22 is pressed by the frame ring 23 and the frame base 71, whereby the curved acoustic sheet 21 and the reinforcing sheet 22 are fixed.

In FIG. 3, the curved acoustic sheet 21 and the reinforcing sheet 22 have a convex shape protruding upward in the drawing. Specifically, the curved acoustic sheet 21 and the reinforcing sheet 22 have a spherical crown shape with a depth d obtained by cutting the sphere having a radius r along a plane.

In addition, in the piezoelectric audio device 61, the frame base 71 has a rectangular parallelepiped outline. The frame ring 23 is pressed against a part of the surface of the frame base 71 on the radiation surface side, and the frame ring 23 is fixed to the frame base 71 by the stopper 27. That is, in this example, the surface of the frame base 71 on the radiation surface side is wider than the entire frame ring 23. Further, the tapered portion corresponding to the tapered portion 31 is also formed on the frame base 71.

As described above, the curved acoustic sheet 21 and the reinforcing sheet 22 may have any curved shape.

For example, the curved acoustic sheet 21 and the reinforcing sheet 22 may have a crown shape with a depth d and with a substantially quadrangular cross-section such as a square cross-section. In addition, for example, the shape of the curved acoustic sheet 21 and the reinforcing sheet 22 may be a complex three-dimensional shape (curved shape) that combines a spherical zone and a spherical crown. Specifically, the portion opposite to the radiation surface side may have a spherical zone shape that is a part of the sphere having a certain radius r1, and the portion on the radiation surface side may have a spherical crown shape that is a part of the sphere having a radius r2.

By appropriately adjusting the shape of the curved acoustic sheet 21 and the reinforcing sheet 22, it is possible to adjust the quality of the sound obtained by the piezoelectric audio device.

Second Modification of First Embodiment

Configuration Example of Piezoelectric Audio Device

Further, the above descriptions are examples in which the piezoelectric audio device 11 is provided with two sheets, the curved acoustic sheet 21 and the reinforcing sheet 22. However, three or more sheets of substantially the same shape may be placed in a layered manner in the piezoelectric audio device, and at least one of the three or more sheets may be a curved acoustic sheet having an acoustic effect.

Figure 4:
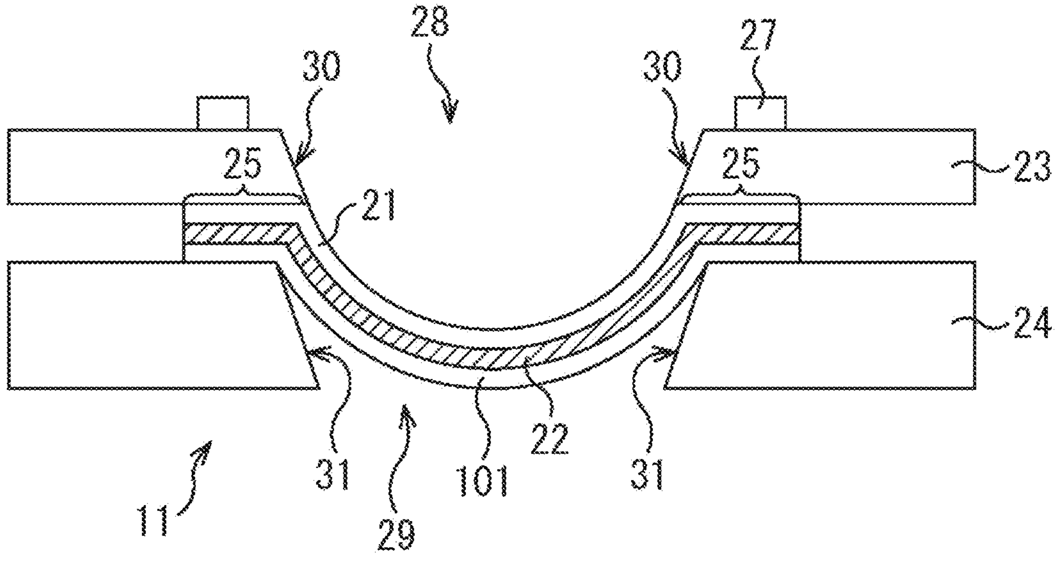
FIG. 4 is a cross-sectional view illustrating another configuration example of the piezoelectric audio device.

In such a case, for example, the piezoelectric audio device 11 is configured as illustrated in FIG. 4. Note that, in FIG. 4, components corresponding to those in FIG. 1 or 2 are denoted by the same reference signs, and the description thereof is appropriately omitted.

FIG. 4 is a cross-sectional view illustrating the piezoelectric audio device 11 including three sheets. In this example, the piezoelectric audio device 11 further includes a curved acoustic sheet 101 in addition to the components of the piezoelectric audio device 11 illustrated in FIGS. 1 and 2. In other words, in the piezoelectric audio device 11 illustrated in FIG. 4, the curved acoustic sheet 21, the reinforcing sheet 22, and the curved acoustic sheet 101 are provided as three sheets, and the curved acoustic sheet 21 and the reinforcing sheet 22 have the same shape as those illustrated in FIGS. 1 and 2.

In this example, the upper side in the drawing is the radiation surface side, and the reinforcing sheet 22 is placed in a layered manner on the side of the curved acoustic sheet 21 opposite to the radiation surface side. In addition, the curved acoustic sheet 101 is placed in a layered manner on the side of the reinforcing sheet 22 opposite to the radiation surface side, that is, on the side of the reinforcing sheet 22 that is not in contact with the curved acoustic sheet 21. Then, the curved acoustic sheet 21, the reinforcing sheet 22, and the curved acoustic sheet 101 have substantially the same shape. With such an arrangement, in the piezoelectric audio device 11 of FIG. 4, the entire curved acoustic sheet 101 is exposed through the opening portion 29.

The curved acoustic sheet 101 is obtained, for example, by using a sheet-like piezoelectric device having an acoustic effect as a material and curving the piezoelectric device by molding such that a part of the piezoelectric device has a three-dimensional shape with a depth d. In addition, the piezoelectric device as the curved acoustic sheet 101 includes electrodes on both surfaces of a piezoelectric material. Further, the piezoelectric device is provided with cover layers for protecting the electrodes as necessary.

In the piezoelectric audio device 11 of FIG. 4, the portion of the molded piezoelectric device that does not serve as the curved acoustic sheet 21, the portion of the molded nonwoven fabric that does not serve as the reinforcing sheet 22, and the portion of the molded piezoelectric device that does not serve as the curved acoustic sheet 101 are the press portion 25. Then, the press portion 25 is sandwiched and pressed between the frame ring 23 and the frame base 24, whereby the curved acoustic sheet 21, the reinforcing sheet 22, and the curved acoustic sheet 101 are fixed to the frame base 24.

In the molding process for the curved acoustic sheet 21, the reinforcing sheet 22, and the curved acoustic sheet 101, it is necessary that the curved acoustic sheet 21, the reinforcing sheet 22, and the curved acoustic sheet 101 be bonded to each other. Therefore, in the molding process, for example, an adhesive is applied to both surfaces of the reinforcing sheet 22 so that the curved acoustic sheet 21 and the reinforcing sheet 22 are bonded and that the reinforcing sheet 22 and the curved acoustic sheet 101 are also bonded. Alternatively, for example, a thermoplastic adhesive may be applied to the reinforcing sheet 22 so that the curved acoustic sheet 21, the reinforcing sheet 22, and the curved acoustic sheet 101 can be bonded simultaneously in the molding process.

As described above, an electroacoustic transducer that is compact, has good frequency characteristics, and has a stable shape can also be obtained by placing the curved acoustic sheet 21, the reinforcing sheet 22, and the curved acoustic sheet 101 having substantially the same shape in a layered manner, as in the case of the piezoelectric audio device 11 illustrated in FIG. 1.

In addition, the curved acoustic sheet 21 and the curved acoustic sheet 101 are polarized in advance. The electrode wiring of the curved acoustic sheet 21 and the curved acoustic sheet 101 can be the wiring indicated by arrow Q11 or arrow Q12 in FIG. 5, for example. Note that, in FIG. 5, components corresponding to those in FIG. 4 are denoted by the same reference signs, and the description thereof is appropriately omitted.

Figure 5:
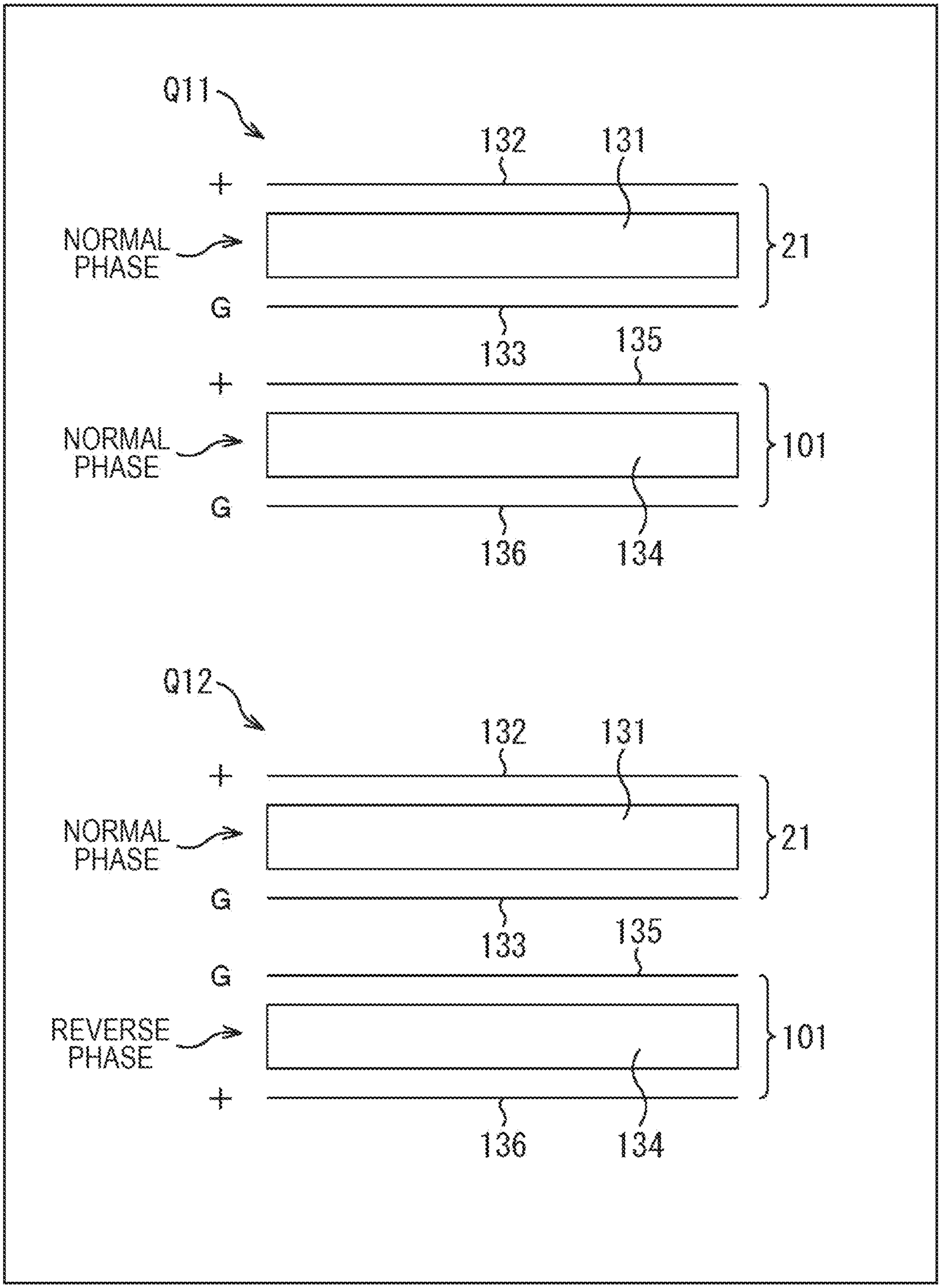
FIG. 5 is a diagram illustrating electrode wiring.

In the example illustrated in FIG. 5, the curved acoustic sheet 21 includes a piezoelectric material 131 and an electrode 132 and an electrode 133 provided on the respective surfaces of the piezoelectric material 131. In particular, in this example, the electrode 132 is connected to the electrode portion 26-1 illustrated in FIG. 1, and the electrode 133 is connected to the electrode portion 26-2 illustrated in FIG. 1.

Similarly, the curved acoustic sheet 101 includes a piezoelectric material 134 and an electrode 135 and an electrode 136 provided on the respective surfaces of the piezoelectric material 134.

In the piezoelectric audio device 11 illustrated in FIG. 4, piezoelectric devices are used as the curved acoustic sheet 21 and the curved acoustic sheet 101, and it is necessary to pull out electrodes from the respective surfaces of these piezoelectric devices.

In addition, in the piezoelectric audio device 11 illustrated in FIG. 4, since the curved acoustic sheet 21, the reinforcing sheet 22, and the curved acoustic sheet 101 are integrally molded, these sheets protrude in the same direction.

Suppose, as indicated by arrow Q11 in FIG. 5, for example, the acoustic signals supplied to the curved acoustic sheet 21 and the curved acoustic sheet 101 have a normal phase with respect to the electrodes 132 and 133 and also have a normal phase with respect to the electrodes 135 and 136. In this case, the electrodes 132 and 135 serve as positive electrodes, and the electrodes 133 and 136 serve as ground side (hereinafter also referred to as G-side) electrodes, that is, negative electrodes.

Therefore, by connecting the positive electrodes 132 and 135 and connecting the G-side electrodes 133 and 136, all the electroacoustically converted outputs are aligned in the same direction, i.e., the upward direction or the downward direction in the drawing. In other words, the curved acoustic sheet 21 and the curved acoustic sheet 101 vibrate in the same direction. Consequently, the sound pressure of the sound to be reproduced can be improved.

In addition, suppose, as indicated by arrow Q12, for example, the acoustic signals supplied to the curved acoustic sheet 21 and the curved acoustic sheet 101 have a normal phase with respect to the electrodes 132 and 133 but have a reverse phase with respect to the electrodes 135 and 136. In this case, since the positive side and the G-side are exchanged in the reverse phase, the electrodes 132 and 136 serve as positive electrodes, and the electrodes 133 and 135 serve as G-side electrodes.

Therefore, by connecting the positive electrodes 132 and 136 and connecting the G-side electrodes 133 and 135, all the electroacoustically converted outputs are aligned in the same direction, i.e., the upward direction or the downward direction in the drawing. In other words, the curved acoustic sheet 21 and the curved acoustic sheet 101 vibrate in the same direction. Consequently, the sound pressure of the sound to be reproduced can be improved.

By connecting the electrodes of the curved acoustic sheet 21 and the curved acoustic sheet 101 in this way, it is possible to more stably retain the shape of the molded curved acoustic sheet 21, reinforcing sheet 22, and curved acoustic sheet 101, and improve the sound pressure sensitivity.

Note that although the reinforcing sheet 22 is provided between the curved acoustic sheet 21 and the curved acoustic sheet 101 in the piezoelectric audio device 11 illustrated in FIG. 4, the reinforcing sheet 22 may not be provided so that the curved acoustic sheet 21 and the curved acoustic sheet 101 are placed adjacent to each other in a layered manner. Since the surfaces of the electrodes provided on the curved acoustic sheet 21 and the curved acoustic sheet 101 are insulated, placing the curved acoustic sheet 21 and the curved acoustic sheet 101 directly in a layered manner does not affect the characteristics and operation of the piezoelectric audio device 11.

In this way, by placing the curved acoustic sheet 21 and the curved acoustic sheet 101 in a layered manner, the shape of the curved acoustic sheet 21 and the curved acoustic sheet 101 can be stabilized without the reinforcing sheet 22. Consequently, it is possible to obtain an electroacoustic transducer that is compact, has good frequency characteristics, and has a stable shape. In this case, for example, the piezoelectric material constituting the curved acoustic sheet 21 and the piezoelectric material constituting the curved acoustic sheet 101 can be bonded and affixed to each other with an adhesive or the like at the stage of pretreatment before molding.

Second Embodiment

Configuration Example of Piezoelectric Audio Apparatus

Next, an embodiment in which the present technology is applied to a piezoelectric audio apparatus having a plurality of the above-described piezoelectric audio devices will be described.

Figure 6:
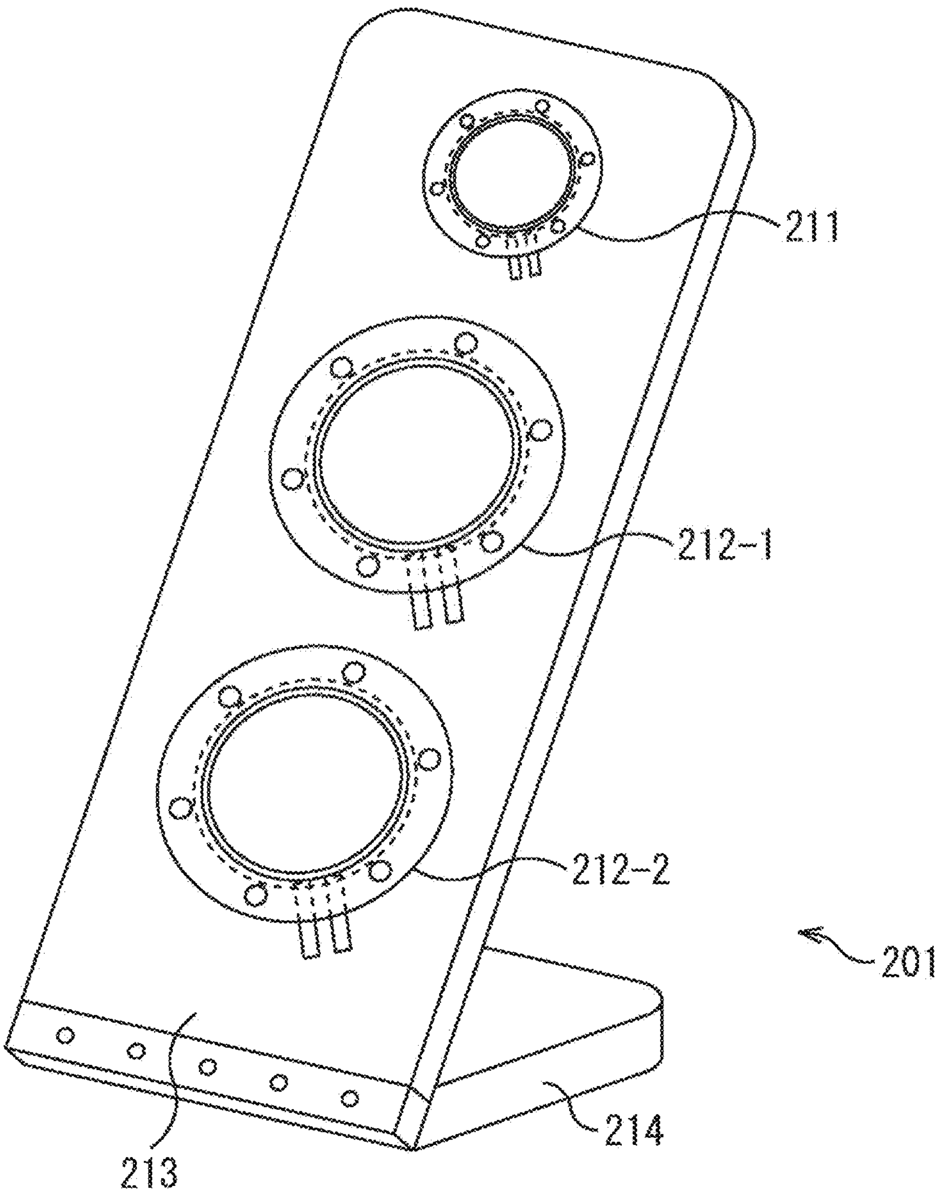
FIG. 6 is a diagram illustrating a configuration example of an appearance of a piezoelectric audio apparatus.

FIG. 6 is a diagram illustrating a configuration example of an appearance of a piezoelectric audio apparatus to which the present technology is applied.

The piezoelectric audio apparatus 201 illustrated in FIG. 6 is a speaker (speaker system), i.e., an electroacoustic transducer apparatus which vibrates according to an electric signal as an input acoustic signal and converts the acoustic signal into sound.

In this example, the piezoelectric audio apparatus 201 has a piezoelectric audio device 211, a piezoelectric audio device 212-1, a piezoelectric audio device 212-2, a frame 213, and a base 214.

In the piezoelectric audio apparatus 201, three piezoelectric audio devices 211, 212-1, and 212-2, each corresponding to the piezoelectric audio device 11 illustrated in FIG. 1, are provided on the plate-like frame 213.

In addition, the base 214 is fixed to the lower side of the frame 213 in the drawing, and the piezoelectric audio apparatus 201 has a self-standing structure owing to the base 214.

The piezoelectric audio device 211 has the same configuration as the piezoelectric audio device 11 illustrated in FIG. 1, for example, and is a high-frequency speaker unit for reproducing sound in a high frequency band, in particular.

On the other hand, the piezoelectric audio device 212-1 and the piezoelectric audio device 212-2 have the same configuration as the piezoelectric audio device 11 illustrated in FIG. 1, for example, and are low-frequency speaker units for reproducing sound in a low frequency band, in particular.

Note that, in the following description, the piezoelectric audio device 212-1 and the piezoelectric audio device 212-2 are also simply referred to as the piezoelectric audio device (s) 212 unless it is necessary to distinguish them.

Here, the high-frequency piezoelectric audio device 211 and the low-frequency piezoelectric audio device 212 have the same configuration, but the area of the curved acoustic sheet and the reinforcing sheet of the high-frequency piezoelectric audio device 211 is smaller than the area of the curved acoustic sheet and the reinforcing sheet of the low-frequency piezoelectric audio device 212. That is, the size of the piezoelectric audio device 211 is smaller than the size of the piezoelectric audio device 212.

Here, the curved acoustic sheet and the reinforcing sheet of the piezoelectric audio device 211 or the piezoelectric audio device 212 correspond to the curved acoustic sheet 21 and the reinforcing sheet 22 illustrated in FIG. 2. In the piezoelectric audio device 211 and the piezoelectric audio device 212, the areas of the surface portions of the curved acoustic sheets and the reinforcing sheets are different.

Note that the configuration of the piezoelectric audio device 211 and the piezoelectric audio device 212 and the shape of the curved acoustic sheets of these piezoelectric audio devices are not limited to the example illustrated in FIG. 1. Any configuration and shape may be employed, such as the configurations and shapes illustrated in FIGS. 3 and 4. In addition, the piezoelectric audio device 211 and the piezoelectric audio device 212 may have different configurations, or may have different shapes of curved acoustic sheets.

The piezoelectric audio device 211 and the piezoelectric audio device 212 may have any configuration as long as the piezoelectric audio device 211 and the piezoelectric audio device 212 can be connected in parallel. For example, the configurations of the low-frequency and high-frequency piezoelectric audio devices may be selected in consideration of the sound pressure difference between the piezoelectric audio devices and the like.

In the piezoelectric audio apparatus 201, the high-frequency piezoelectric audio device 211 and the two low-frequency piezoelectric audio devices 212 are electrically connected in parallel. Consequently, the piezoelectric audio apparatus 201 as an integrated speaker system can be driven with a single-channel amplifier.

Note that although the two low-frequency piezoelectric audio devices 212 are provided in this example, the number of low-frequency piezoelectric audio devices 212 may be one or may be three or more. Similarly, two or more high-frequency piezoelectric audio devices 211 may be provided. Further, three or more piezoelectric audio devices including curved acoustic sheets with different areas may be provided on the piezoelectric audio apparatus 201. For example, a middle-frequency piezoelectric audio device may be provided.

Example Circuit Configuration of Piezoelectric Audio Apparatus

Figure 7:
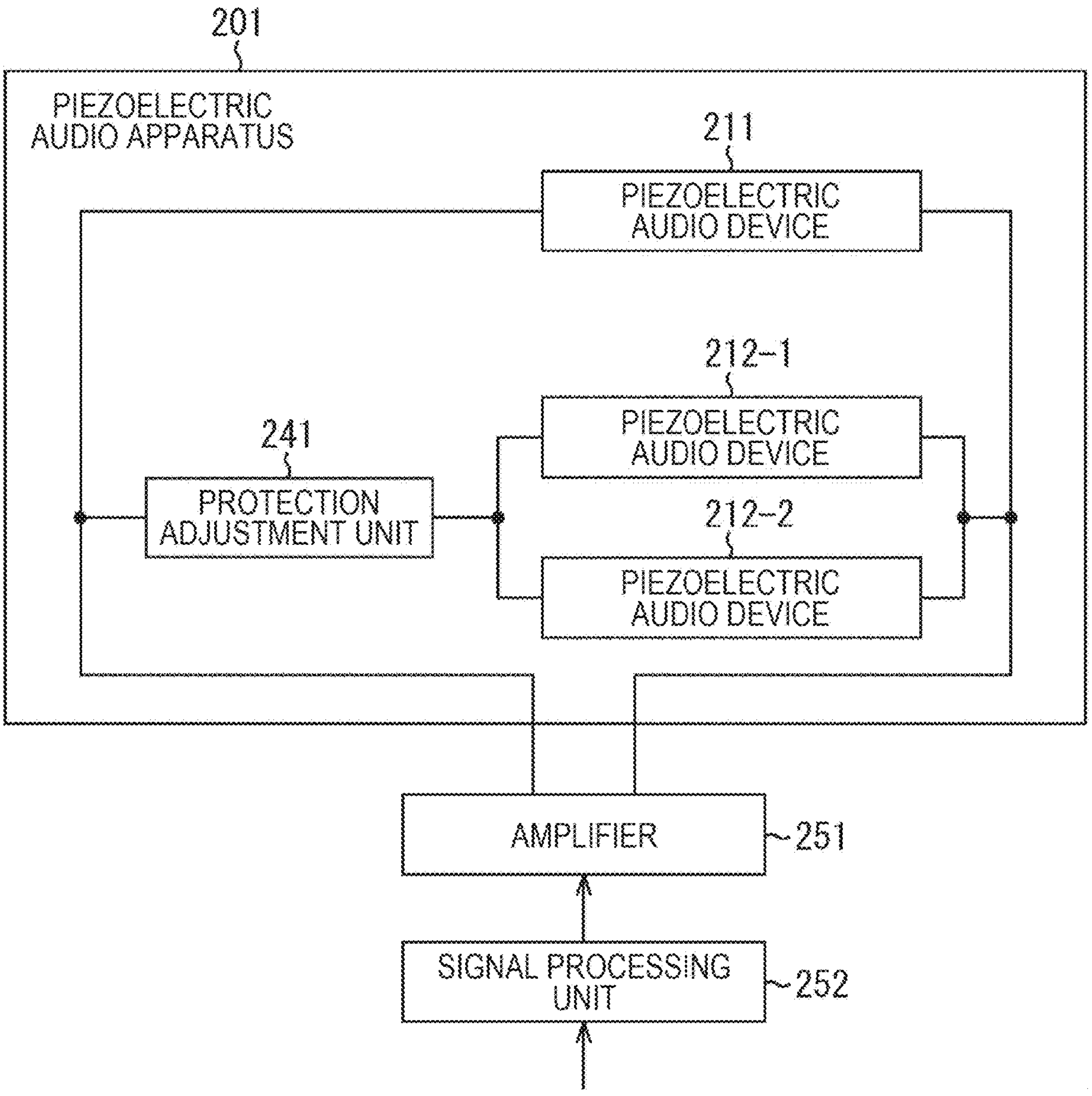
FIG. 7 is a diagram illustrating an example circuit configuration of the piezoelectric audio apparatus.

Next, the circuit configuration of the piezoelectric audio apparatus 201 illustrated in FIG. 6 will be described. FIG. 7 is a diagram illustrating an example circuit configuration of the piezoelectric audio apparatus 201. Note that, in FIG. 7, components corresponding to those in FIG. 6 are denoted by the same reference signs, and the description thereof is appropriately omitted.

The piezoelectric audio apparatus 201 illustrated in FIG. 7 includes the piezoelectric audio device 211, the piezoelectric audio device 212-1, the piezoelectric audio device 212-2, and a protection adjustment unit 241.

In addition, an external sound reproduction control device having an amplifier 251 and a signal processing unit 252 is connected to the piezoelectric audio apparatus 201.

Specifically, the piezoelectric audio device 211, the piezoelectric audio device 212-1, and the piezoelectric audio device 212-2 are connected in parallel to the amplifier 251. In particular, the protection adjustment unit 241 is connected in series between one electrode of the low-frequency piezoelectric audio device 212-1 and the piezoelectric audio device 212-2 and the amplifier 251. This protection adjustment unit 241 is not connected to the high-frequency piezoelectric audio device 211. Specifically, the protection adjustment unit 241 is not connected in series to the high-frequency piezoelectric audio device 211.

For example, the electrode portion of the piezoelectric audio device 211 corresponding to the electrode portion 26-1 illustrated in FIG. 1 and the electrode portion of the piezoelectric audio device 211 corresponding to the electrode portion 26-2 illustrated in FIG. 1 are connected via different acoustic signal lines to the amplifier 251.

Similarly, the electrode portion of the piezoelectric audio device 212 corresponding to the electrode portion 26-1 illustrated in FIG. 1 and the electrode portion of the piezoelectric audio device 212 corresponding to the electrode portion 26-2 illustrated in FIG. 1 are connected via different acoustic signal lines to the amplifier 251, and the protection adjustment unit 241 is connected in series between one of the electrode portions and the amplifier 251.

The protection adjustment unit 241 includes, for example, a protection resistor or the like. The protection adjustment unit 241 protects the piezoelectric audio device 212 and the amplifier 251 and adjusts the frequency characteristics of the piezoelectric audio device 212, that is, the piezoelectric audio apparatus 201.

Note that the resistance value of the protection resistor as the protection adjustment unit 241 is determined, for example, in consideration of the impedance of the entire piezoelectric audio apparatus 201 and the characteristics of the crossover between the frequency characteristics of the high-frequency piezoelectric audio device 211 and the frequency characteristics of the low-frequency piezoelectric audio device 212. In addition, instead of a protection resistor, the protection adjustment unit 241 may be a low-pass filter or the like including a protection resistor and an inductor, for example.

At the time of reproducing the sound based on the acoustic signal, the signal processing unit 252 appropriately performs various types of processing such as acoustic characteristic correction processing on the acoustic signal, and the resulting acoustic signal is supplied from the signal processing unit 252 to the amplifier 251.

Then, the acoustic signal is amplified by the amplifier 251 and supplied to the piezoelectric audio device 211 and the piezoelectric audio device 212. At this time, the acoustic signal output from one end of the amplifier 251 is directly supplied to the piezoelectric audio device 211, and also supplied to the piezoelectric audio device 212 via the protection adjustment unit 241. In addition, the acoustic signal output from the other end of the amplifier 251 is directly supplied to the piezoelectric audio device 211 and the piezoelectric audio device 212.

Then, the piezoelectric audio device 211 and the piezoelectric audio device 212 vibrate according to the supplied acoustic signal to reproduce the sound.

In this case, regarding the frequency band of the sound to be reproduced, the low frequency sound is reproduced exclusively by the low-frequency piezoelectric audio device 212, and the high frequency sound is reproduced exclusively by the high-frequency piezoelectric audio device 211.

Figure 8:
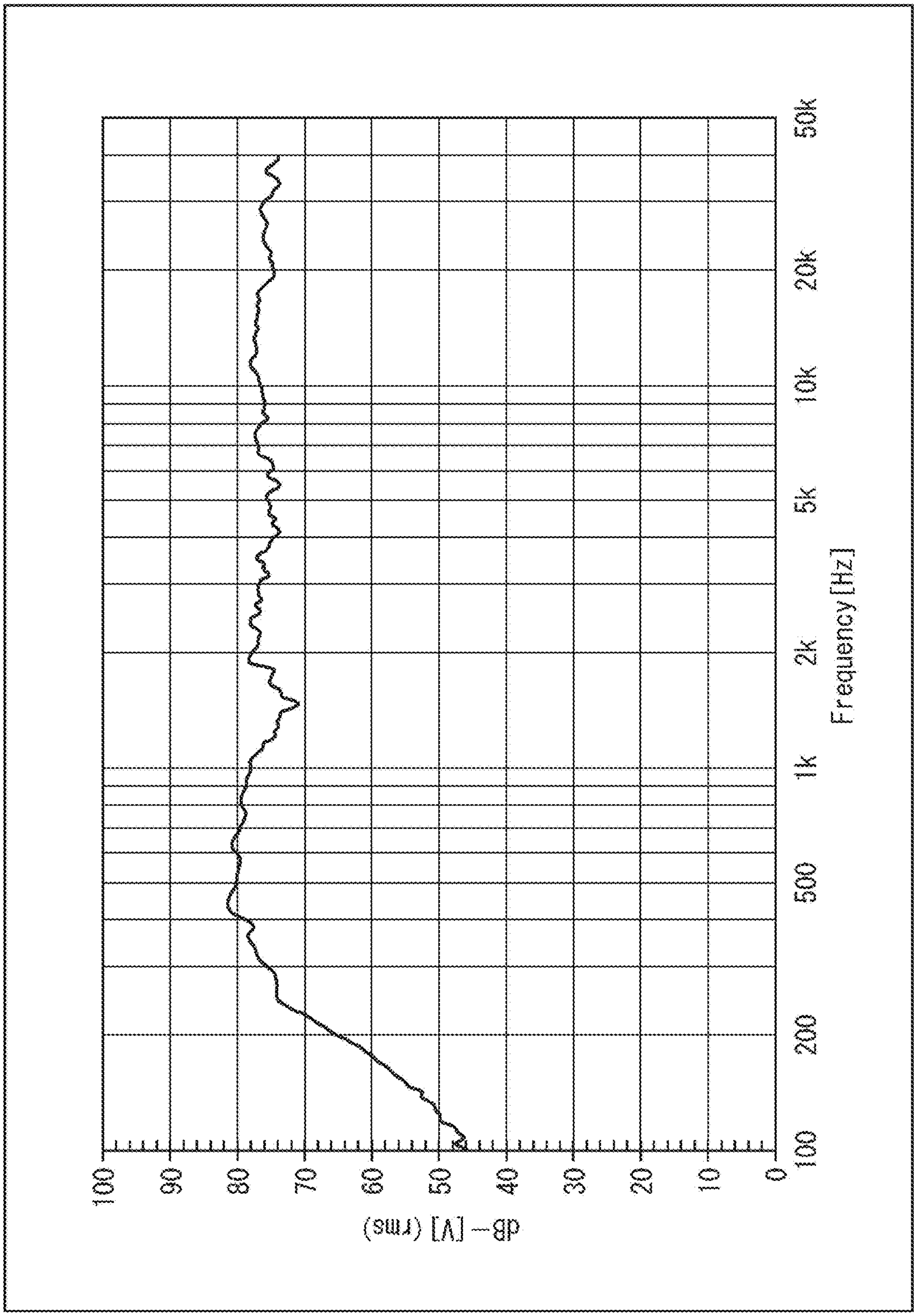
FIG. 8 is a diagram illustrating the frequency characteristics of a piezoelectric audio apparatus.

Meanwhile, the frequency characteristics of the entire piezoelectric audio apparatus 201 are as illustrated in FIG. 8, for example. Note that, in FIG. 8, the horizontal axis represents frequency, and the vertical axis represents sound pressure.

FIG. 8 illustrates the measured frequency characteristics of the entire system of the piezoelectric audio apparatus 201. In this example, regarding the frequency characteristics of the piezoelectric audio apparatus 201, it is understood that a sufficient sound pressure is secured at each frequency from the low frequency range to the super high frequency range, and good frequency characteristics with few peaks and dips are obtained.

In the piezoelectric audio apparatus 201, frequencies of around 2 kHz are frequencies near the crossover where the sound pressure of the high-frequency piezoelectric audio device 211 is equal to the sound pressure of the low-frequency piezoelectric audio device 212.

In the frequency band near the crossover, the frequency characteristics attenuated by the natural characteristics of the piezoelectric audio device 211 and the frequency characteristics of the two piezoelectric audio devices 212 attenuated by the series-connected protection adjustment unit 241 are combined, whereby good frequency characteristics can be obtained.

Figure 9:
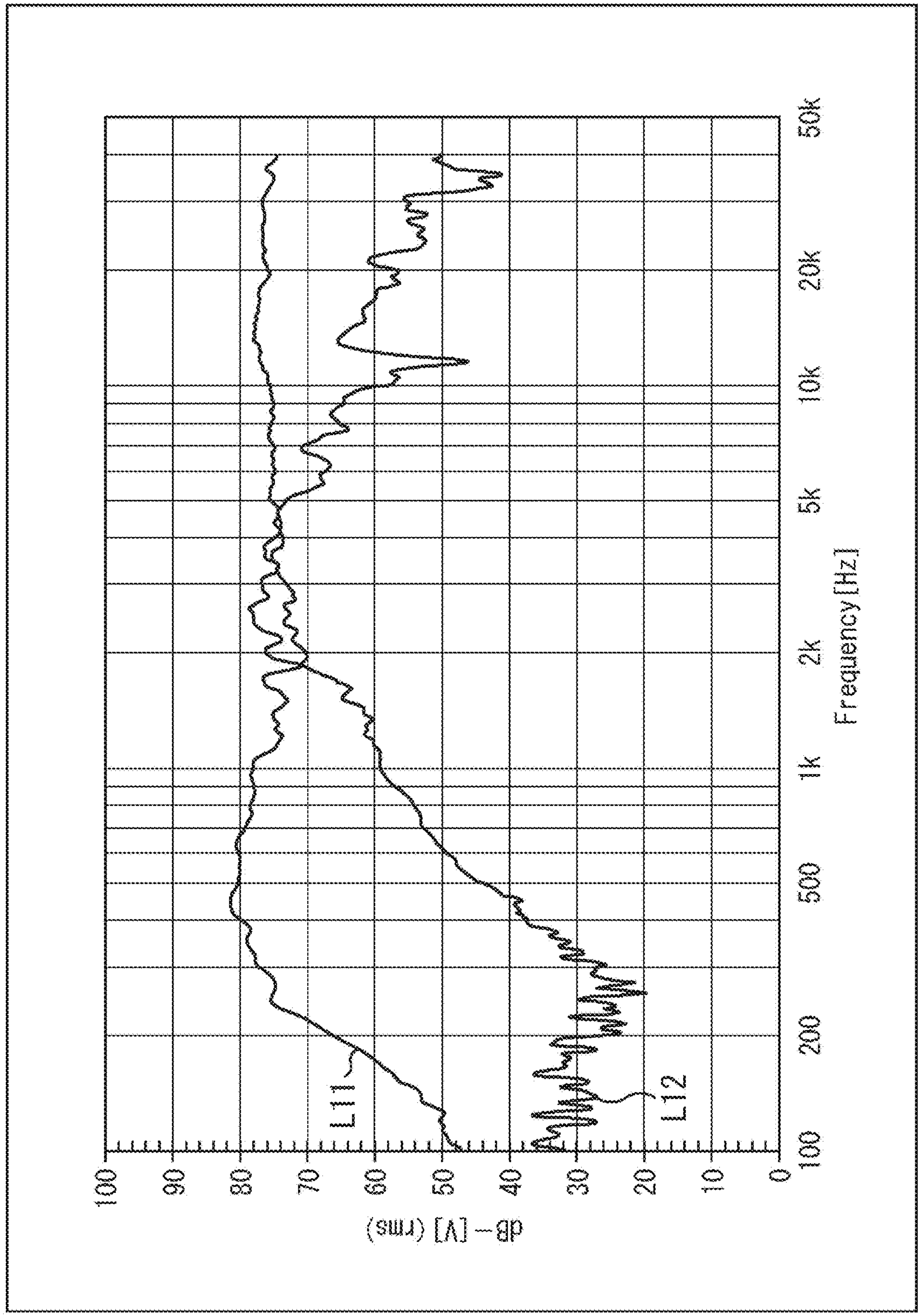
FIG. 9 is a diagram illustrating the frequency characteristics of high-frequency and low-frequency piezoelectric audio devices.

FIG. 9 is a diagram illustrating the measured frequency characteristics of the high-frequency piezoelectric audio device 211 and the measured frequency characteristics of the two low-frequency piezoelectric audio devices 212. Note that, in FIG. 9, the horizontal axis represents frequency, and the vertical axis represents sound pressure.

In FIG. 9, curve L11 indicates the frequency characteristics obtained when sounds are simultaneously reproduced by the two low-frequency piezoelectric audio devices 212, and curve L12 indicates the frequency characteristics obtained when sounds are reproduced only by the high-frequency piezoelectric audio device 211.

In this example, the crossover frequency is around 2 kHz at which the sound pressures of curves L11 and L12 are approximately equal to each other.

In addition, as can be seen from curve L12, the sound pressure drops in the low frequency range due to the area of the curved acoustic sheet of the piezoelectric audio device 211.

On the other hand, as can be seen from curve L11, the sound pressure drops in the high frequency range due to the protection adjustment unit 241.

However, if the piezoelectric audio device 211 and the piezoelectric audio device 212 are used in combination, as illustrated in FIG. 8, good frequency characteristics with few peaks and dips can be obtained from the low frequency range to a super high frequency of 40 kHz or more.

Here, the operation of the piezoelectric audio apparatus 201 in the case of considering the reproduction at a super high frequency of 40 kHz or more will be described.

Figure 10:
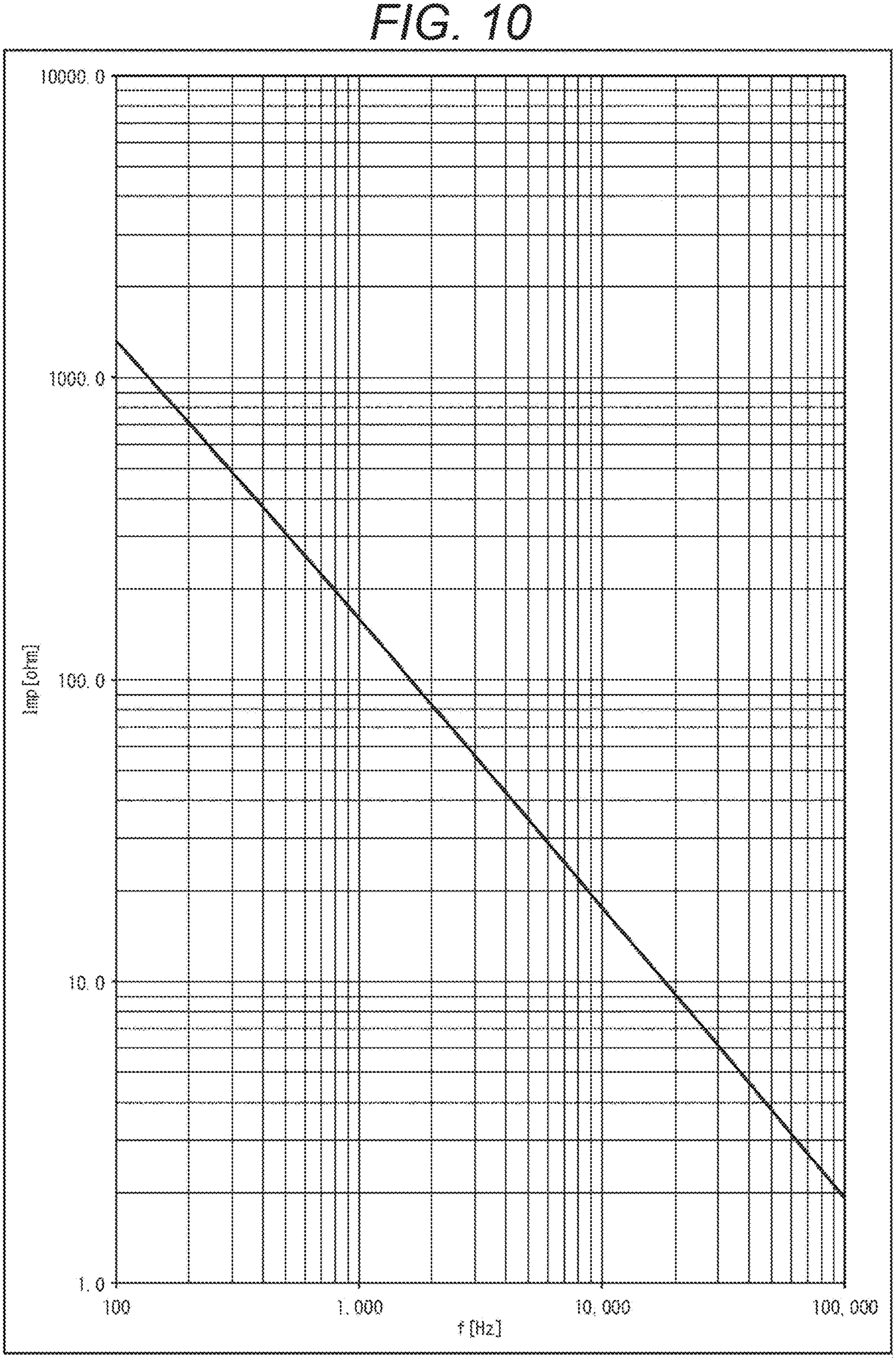
FIG. 10 is a diagram illustrating the impedance characteristics of low-frequency piezoelectric audio devices.

FIG. 10 illustrates the impedance characteristics of the two low-frequency piezoelectric audio devices 212, that is, an example impedance at each frequency. Note that, in FIG. 10, the horizontal axis represents frequency, and the vertical axis represents impedance.

As can be seen from FIG. 10, the piezoelectric audio device 212 has capacitive frequency characteristics. Therefore, higher frequencies make the impedance lower. In the example illustrated in FIG. 10, the impedance of the piezoelectric audio device 212 is lower at higher frequencies.

Therefore, in general, a protection resistor is connected in series between the amplifier and each piezoelectric audio device in order to protect the system. However, in terms of the reproduction in a super high frequency band, the protection resistor causes a voltage dividing effect, resulting in a sound pressure drop in the super high frequency range.

Therefore, in the piezoelectric audio apparatus 201, the protection adjustment unit 241 is connected only to the two low-frequency piezoelectric audio devices 212 having a low impedance so that the path for the high-frequency piezoelectric audio device 211 is not affected by the protection adjustment unit 241.

This is because the high-frequency piezoelectric audio device 211 in which the area of the curved acoustic sheet having an acoustic effect is relatively small can secure a sufficient impedance even in the super high frequency range, and thus has less need for connection to the protection adjustment unit 241 than the low-frequency piezoelectric audio device 212.

On the other hand, the low-frequency piezoelectric audio device 212 including the curved acoustic sheet with a relatively large area is protected by being connected to the protection adjustment unit 241. In addition, the frequency characteristics of the piezoelectric audio device 212 can be adjusted by the connected protection adjustment unit 241. For example, by appropriately adjusting the resistance value of the protection resistor as the protection adjustment unit 241, it is possible to change the frequency characteristics of the piezoelectric audio device 212 indicated by curve L11 in FIG. 9.

As described above, the protection adjustment unit 241 is not connected to the piezoelectric audio device 211, and the protection adjustment unit 241 is connected only to the piezoelectric audio device 212, whereby the piezoelectric audio apparatus 201 can be appropriately protected, and good frequency characteristics can be obtained even in the super high frequency range.

Method of Manufacturing Piezoelectric Audio Device

Meanwhile, the piezoelectric audio devices described above can be manufactured by, for example, pneumatic molding or the like.

Here, the method of manufacturing a piezoelectric audio device by pneumatic molding will be described with reference to FIGS. 11 to 13.

Figure 11:
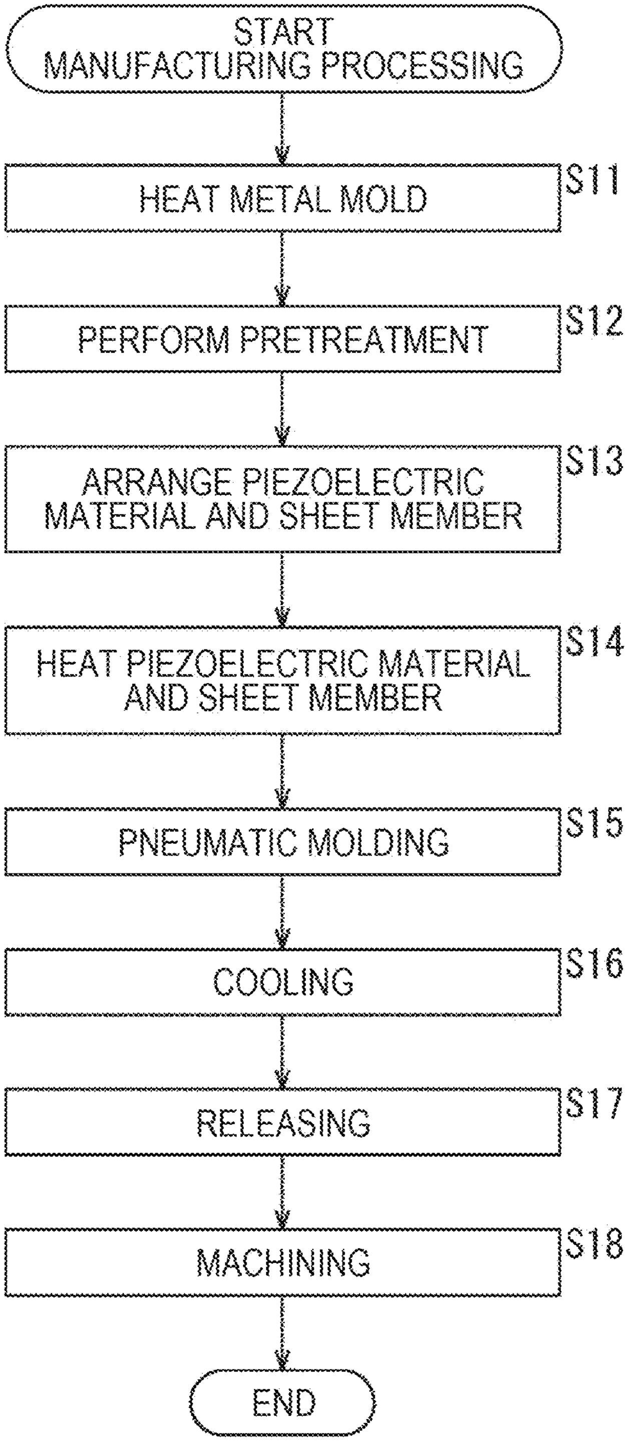
FIG. 11 is a flowchart for explaining manufacturing processing.
Figure 12:
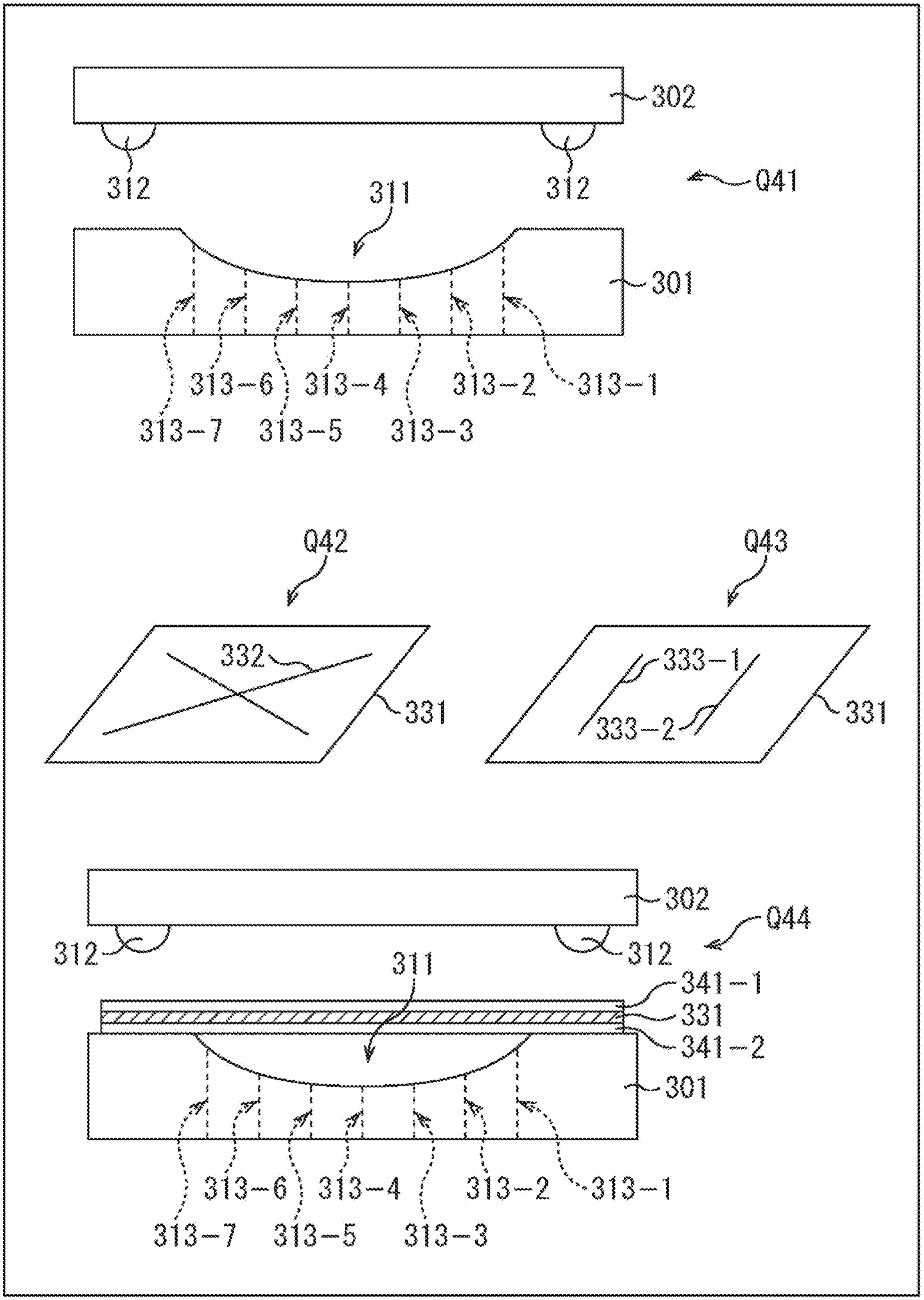
FIG. 12 is a view illustrating an example procedure for manufacturing a piezoelectric audio device.
Figure 13:
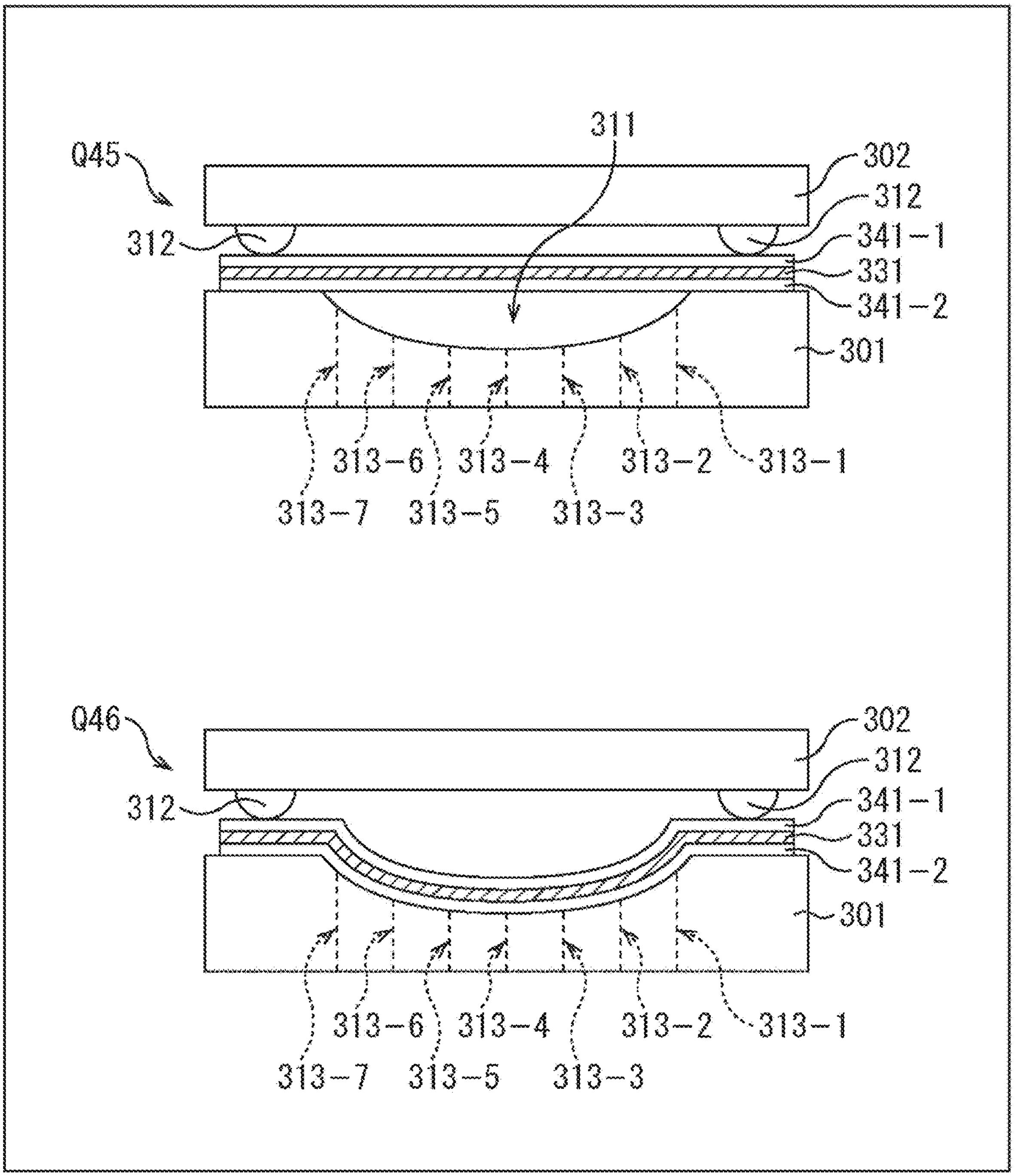
FIG. 13 is a view illustrating an example procedure for manufacturing a piezoelectric audio device.

Note that FIG. 11 is a flowchart for explaining the manufacturing processing for manufacturing a piezoelectric audio device, and FIGS. 12 and 13 are diagrams for explaining the procedure for manufacturing a piezoelectric audio device. Note that, in FIGS. 12 and 13, components corresponding to each other are denoted by the same reference signs, and the description thereof is appropriately omitted.

In the manufacturing processing illustrated in FIG. 11, a metal mold is heated in step S11.

Specifically, as indicated by arrow Q41 in FIG. 12, for example, a pneumatic molding machine, which is a manufacturing apparatus for manufacturing a piezoelectric audio device, has a three-dimensional metal mold 301 with a predetermined depth and a cylindrical pneumatic portion 302 for performing molding using air pressure.

The metal mold 301 has, on its surface portion, a concave portion 311 having substantially the same shape as the radiation surface portion of the curved acoustic sheet of the piezoelectric audio device to be manufactured. A heating mechanism and a cooling mechanism (not illustrated) are connected to the metal mold 301.

In addition, the surface of the pneumatic portion 302 facing the metal mold 301 is provided with a ring-shaped fixing portion 312. The fixing portion 312 includes a heat-resistant member such as silicon, for example, and is used for forming a sealed space between the metal mold 301 and the pneumatic portion 302.

The fixing portion 312 also serves to press a sheet-like piezoelectric material (piezoelectric device) and a sheet member, which are materials for the piezoelectric audio device, against the metal mold 301 so that the piezoelectric device and the sheet member are immovably fixed.

Here, the piezoelectric material is a member that forms the curved acoustic sheet and a part of the press portion of the piezoelectric audio device, and the sheet member is a member that forms the reinforcing sheet and a part of the press portion of the piezoelectric audio device.

Further, in the metal mold 301, small through holes 313-1 to 313-7 depicted by dotted lines in the drawing are provided. Note that, in the following description, the through holes 313-1 to 313-7 are also simply referred to as the through hole(s) 313 unless it is necessary to distinguish them.

In this example, the plurality of through holes 313 with a small diameter extending between the upper and lower surfaces of the metal mold 301 in the drawing is formed in the concave portion 311 on the surface of the metal mold 301. These through holes 313 are for releasing air during the pneumatic molding as described later.

Step S11 is a heating process, in which the metal mold 301 is heated by the heating mechanism (not illustrated). Note that the heating temperature for the metal mold 301 is determined in consideration of the characteristics of the piezoelectric material as a material for the piezoelectric audio device. Here, for example, the set heating temperature for the metal mold 301 is lower than the Curie point, so that the piezoelectric property of the piezoelectric material (piezoelectric device) does not disappear.

In step S12, pretreatment or the like for the sheet member which is a material for the piezoelectric audio device is performed as necessary.

In this pretreatment process, for example, as indicated by arrow Q42 in FIG. 12, slits 332 are formed by cutting a sheet member 331 which is a material for the piezoelectric audio device. In this example, the rectangular sheet-like sheet member 331 includes the cross-shaped slits 332, i.e., perpendicular straight lines that are long in the diagonal directions.

Note that the slits 332 are for releasing air during the pneumatic molding described later. The shape of the slits 332 may be any shape. For example, as indicated by arrow Q43, two rectilinear parallel cuts may be made as slits 333-1 and 333-2 in the rectangular sheet-like sheet member 331.

In addition, in the pretreatment process, the piezoelectric material and the sheet member are bonded. For example, an adhesive is used to bond the first piezoelectric material and the second piezoelectric material. Alternatively, for example, the sheet member coated with an adhesive is sandwiched between the first piezoelectric material and the second piezoelectric material, and they are affixed to each other, whereby the first piezoelectric material and the second piezoelectric material are bonded.

In step S13, sheets serving as materials for the piezoelectric audio device, that is, the piezoelectric material and the sheet member, are arranged on the upper surface of the metal mold.

For example, as indicated by arrow Q44 in FIG. 12, suppose sheet-like piezoelectric materials 341-1 and 341-2 cut into an appropriate size and the sheet member 331 are used as materials for the piezoelectric audio device.

In this case, with the sheet member 331 located between the piezoelectric material 341-1 and the piezoelectric material 341-2, the piezoelectric material 341-1, the sheet member 331, and the piezoelectric material 341-2 are aligned in a layered manner and arranged on the surface (upper surface) of the heated metal mold 301 facing the pneumatic portion 302. Note that, in the following description, the piezoelectric material 341-1 and the piezoelectric material 341-2 are also simply referred to as the piezoelectric material(s) 341 unless it is necessary to distinguish them.

Subsequently, in step S14, the piezoelectric material and the sheet member on the metal mold are heated.

That is, as indicated by arrow Q45 in FIG. 13, the pneumatic portion 302 is mechanically pressed against the metal mold 301, with the piezoelectric material 341 and the sheet member 331 on the metal mold 301. At this time, the piezoelectric material 341 and the sheet member 331 are pressed and fixed to the upper surface of the metal mold 301 by the fixing portion 312, and the space surrounded by the upper surface of the metal mold 301, the surface of the pneumatic portion 302 facing the metal mold 301, and the fixing portion 312 (hereinafter also referred to as a pneumatic molding space) is sealed. That is, a certain level of airtightness is given to the pneumatic molding space containing the piezoelectric material 341 and the sheet member 331.

While the metal mold 301 is continuously heated in such a state, the piezoelectric material 341 and the sheet member 331 are heated by the metal mold 301. Note that the heating time for the piezoelectric material 341 and the sheet member 331 is appropriately determined in consideration of the characteristics of the piezoelectric audio device to be manufactured.

In step S15, the piezoelectric material and the sheet member are pneumatically molded.

In the pneumatic molding process, as indicated by arrow Q46 in FIG. 13, for example, while the piezoelectric material 341 and the sheet member 331 are heated by the metal mold 301, air pressure is applied by the pneumatic portion 302 to the piezoelectric material 341 and the sheet member 331 located on the upper surface of the metal mold 301 in the pneumatic molding space.

As a result, the piezoelectric material 341 and the sheet member 331 are pressure-bonded to the concave portion 311 of the metal mold 301 by the air pressure, and the central portion of the piezoelectric material 341 and the sheet member 331 is pneumatically molded into the shape of the concave portion 311. That is, the central portion of the piezoelectric material 341 and the sheet member 331 is molded into a three-dimensional shape having a depth similar to the depth of the concave portion 311.

Here, the three-dimensional portion of the piezoelectric material 341 formed by pneumatic molding, that is, the portion of the piezoelectric material 341 molded into substantially the same shape as the concave portion 311, is used as the curved acoustic sheet portion of the above-described piezoelectric audio device. Similarly, the three-dimensional portion of the sheet member 331 formed by pneumatic molding, that is, the portion of the sheet member 331 molded into substantially the same shape as the concave portion 311, is used as the reinforcing sheet portion of the above-described piezoelectric audio device. In addition, the remaining portion of the piezoelectric material 341 and the sheet member 331 provided at the end of the curved acoustic sheet portion and the reinforcing sheet portion is used as the press portion.

In the example illustrated in FIG. 13, the pneumatic portion 302 has a structure capable of applying pressure to the pneumatic molding space by delivering gas from the rear side thereof.

Further, in the concave portion 311 on the surface of the metal mold 301, the plurality of through holes 313 with a small diameter passing through the metal mold 301 is formed.

In the pneumatic molding process, the air between the piezoelectric material 341 with the sheet member 331 and the concave portion 311 can be released to the outside of the pneumatic molding space through the through holes 313. In addition, since the slits 332 are provided in the sheet member 331, the air between the piezoelectric material 341 and the sheet member 331 can be released by the slits 332 during the pneumatic molding.

By releasing air through the through holes 313 and the slits 332 in this way, it is possible to prevent the generation of wrinkles and bubbles in the piezoelectric material 341 and the sheet member 331 at the time of pneumatic molding, thereby obtaining a piezoelectric audio device with good visual quality and acoustic characteristics. In particular, in a case where the plurality of through holes 313 is provided, these through holes 313 can be provided at equal intervals or concentrically on the surface of the metal mold 301 to release air more appropriately. Thus, the processing precision can be improved during the pneumatic molding.

Generally, the piezoelectric material 341 or the like includes, as a cover layer, a resin film with very low air permeability such as polyethylene terephthalate, polyethylene naphthalate, polyimide, polyetherimide, and polycarbonate. Therefore, by allowing air to be released in the pneumatic molding process, the piezoelectric material 341 and the sheet member 331 can be more suitably brought into close contact with each other.

In step S16, the piezoelectric material and the sheet member are entirely cooled while pressure is applied to the piezoelectric material and the sheet member.

In the cooling process, for example, the metal mold 301 is cooled in the state indicated by arrow Q46 in FIG. 13, so that the piezoelectric material 341 and the sheet member 331 are cooled while pressure is applied to the piezoelectric material 341 and the sheet member 331. As a result, the piezoelectric material 341 and the sheet member 331 molded at a predetermined temperature can retain their shape while the piezoelectric material 341 and the sheet member 331 are bonded to each other.

In step S17, the molded piezoelectric material and sheet member are integrally released from the metal mold.

For example, in the example illustrated in FIGS. 12 and 13, the piezoelectric material 341 and the sheet member 331 are removed from the metal mold 301.

According to the above processes, the curved acoustic sheet and the reinforcing sheet having a three-dimensional shape with a predetermined depth and the press portion continuously integrated with the curved acoustic sheet and the reinforcing sheet for fixing at least a part of the curved acoustic sheet and the reinforcing sheet are simultaneously molded.

In step S18, the piezoelectric material and the sheet member are appropriately machined.

Specifically, in the example illustrated in FIGS. 12 and 13, the machining process is performed, for example, for cutting the end portion of the piezoelectric material 341 and the sheet member 331 in accordance with the shape of the press portion or the like or providing electrode portions for pulling out electrodes on the piezoelectric material 341.

As the result of the above machining, the finished piezoelectric audio device is obtained, and the manufacturing processing is completed.

For example, in the example illustrated in FIGS. 12 and 13, the piezoelectric audio device similar to the piezoelectric audio device 11 illustrated in FIG. 4 is obtained. In this example, the central portion of the piezoelectric material 341 in FIGS. 12 and 13 corresponds to the curved acoustic sheet 21 and the curved acoustic sheet 101 in FIG. 4, and the central portion of the sheet member 331 in FIGS. 12 and 13 corresponds to the reinforcing sheet 22 in FIG. 4.

Note that although the two piezoelectric materials and the one sheet member are placed in a layered manner in this example, a piezoelectric audio device including two piezoelectric materials placed in a layered manner or a piezoelectric audio device including one piezoelectric material and one sheet member placed in a layered manner can also be manufactured using the processing similar to the manufacturing processing described with reference to FIG. 11.

In addition, in a case where one piezoelectric material and one sheet member are placed in a layered manner, it is preferable that the sheet member include a material having air permeability such as a nonwoven fabric, for example. In this case, the material with high air permeability allows the air between the piezoelectric material and the sheet member to be released in the pneumatic molding process, so that the piezoelectric material and the sheet member can be more suitably brought into close contact with each other.

Note that, a material having air permeability such as a nonwoven fabric can also be used as a sheet member that is arranged between two piezoelectric materials, for example, as described with reference to FIGS. 12 and 13. With such a configuration, the air between the piezoelectric materials and the sheet member can be released in the pneumatic molding process using the material having air permeability, so that one piezoelectric material and the sheet member and the other piezoelectric material and the sheet member can be more suitably brought into close contact with each other.

Further, on the sheet surface of the sheet member, a thermoplastic adhesive may be applied as an adhesive to the sheet surface, or a film-like adhesive (for example, a thermoplastic adhesive) including an elastomer resin may be used as a material for the sheet member. In this case, the sheet surface does not have adhesiveness to another piezoelectric material or the like at room temperature, and becomes adhesive when heated at a temperature exceeding a predetermined temperature. Therefore, the sheet surface has adhesiveness only while being heated in the pneumatic molding process. Specifically, in the pneumatic molding process, for example, two piezoelectric materials are bonded with a film-like adhesive used as the sheet member arranged between the two piezoelectric materials. Therefore, handling becomes easier in the pneumatic molding process, and molding can be suitably performed.

The piezoelectric audio device can be suitably molded using the manufacturing processing for the piezoelectric audio device described above.

Note that, in this example, pneumatic molding is used as the method of manufacturing a piezoelectric audio device, that is, the method of molding a piezoelectric audio device. Particularly, if pneumatic molding is adopted as the method of molding a piezoelectric audio device, a piezoelectric audio device can be obtained at lower cost than in a case where press molding or the like is adopted, and a piezoelectric material or a sheet member with a freely designed or changed thickness can be easily molded. However, any method can be used for molding a piezoelectric audio device, such as press molding, vacuum molding, and a combination thereof.

It should be noted that the embodiments of the present technology are not limited to the above-mentioned embodiments, and can be variously changed in a range not departing from the gist of the present technology.

In addition, the effects described in the present description are only examples, and the effects of the present technology are not limited to these effects. Additional effects may also be obtained.

Further, the present technology can be configured as follows.

(1)

An electroacoustic transducer including:

a first sheet including a sheet-like piezoelectric material and having a curved shape; and a second sheet having substantially the same shape as the first sheet and placed on the first sheet in a layered manner.

(2)

The electroacoustic transducer according to (1), in which the second sheet is a nonwoven fabric.

(3)

The electroacoustic transducer according to (2), further including a third sheet including a sheet-like piezoelectric material, having substantially the same shape as the first sheet, and placed in a layered manner on an opposite side of the second sheet that is not in contact with the first sheet.

(4)

The electroacoustic transducer according to (1), in which the second sheet includes a piezoelectric material.

(5)

The electroacoustic transducer according to any one of (1) to (4), in which the second sheet is bonded to the first sheet.

(6)

The electroacoustic transducer according to any one of (1) to (5), in which the first sheet and the second sheet are fixed by sandwiching and pressing a press portion provided at an end portion of the first sheet and the second sheet between a frame fixing member and a frame base.

(7)

The electroacoustic transducer according to (6), in which the frame fixing member and the frame base include opening portions for exposing the first sheet and the second sheet.

(8)

The electroacoustic transducer according to (7), in which a tapered portion is formed on at least one of the frame fixing member or the frame base such that the opening portion has varying widths in a first direction in which the frame fixing member and the frame base are aligned when viewed from a second direction substantially perpendicular to the first direction.

(9)

The electroacoustic transducer according to (8), in which the tapered portion is formed such that the opening portion becomes wider toward a position farthest from the first sheet and the second sheet in the first direction.

(10)

The electroacoustic transducer according to (8), in which the tapered portion is formed such that the opening portion becomes narrower toward a position farthest from the first sheet and the second sheet in the first direction.

(11)

An electroacoustic transducer apparatus including:

a first electroacoustic transducer having: a first sheet having a curved shape and including a sheet-like piezoelectric material; and a second sheet having substantially the same shape as the first sheet and placed on the first sheet in a layered manner; and a second electroacoustic transducer having a third sheet including a sheet-like piezoelectric material, having a curved shape, and having an area different from an area of the first sheet of the second sheet.

(12)

The electroacoustic transducer apparatus according to (11), in which the first electroacoustic transducer or the second electroacoustic transducer is a low-frequency electroacoustic transducer, and a protection adjustment unit is connected to the low-frequency electroacoustic transducer to protect the low-frequency electroacoustic transducer and adjust frequency characteristics.

(13)

The electroacoustic transducer apparatus according to (12), in which the protection adjustment unit is a protection resistor or a low-pass filter.

(14)

An electroacoustic transducer apparatus including:

a first electroacoustic transducer having: a first sheet having a curved shape and including a sheet-like piezoelectric material; and a second sheet having substantially the same shape as the first sheet and placed on the first sheet in a layered manner; and a second electroacoustic transducer having: a third sheet having a curved shape and including a sheet-like piezoelectric material; and a fourth sheet having substantially the same shape as the third sheet and placed on the third sheet in a layered manner, the third sheet and the fourth sheet having an area different from an area of the first sheet and the second sheet.

REFERENCE SIGNS LIST

11 Piezoelectric audio device
21 Curved acoustic sheet
22 Reinforcing sheet
23 Frame ring
24 Frame base
25 Press portion
28 Opening portion
29 Opening portion
30 Tapered portion
31 Tapered portion
101 Curved acoustic sheet
201 Piezoelectric audio apparatus
211 Piezoelectric audio device
212-1, 212-2, 212 Piezoelectric audio device
241 Protection adjustment unit

The invention claimed is:

1. An electroacoustic transducer comprising:

a first sheet including a sheet-like piezoelectric material and having a curved shape;

a second sheet having substantially a same shape as the first sheet and placed on the first sheet in a layered manner, wherein the second sheet is a nonwoven fabric; and a third sheet including a sheet-like piezoelectric material, having substantially a same shape as the first sheet, and placed in a layered manner on an opposite side of the second sheet that is not in contact with the first sheet.

2. The electroacoustic transducer according to claim 1, wherein the second sheet includes a piezoelectric material.

3. The electroacoustic transducer according to claim 1, wherein the second sheet is bonded to the first sheet.

4. The electroacoustic transducer according to claim 1, wherein the first sheet and the second sheet are fixed by sandwiching and pressing a press portion provided at an end portion of the first sheet and the second sheet between a frame fixing member and a frame base.

5. The electroacoustic transducer according to claim 4, wherein the frame fixing member and the frame base include opening portions for exposing the first sheet and the second sheet.

6. The electroacoustic transducer according to claim 5, wherein a tapered portion is formed on at least one of the frame fixing member or the frame base such that the opening portion has varying widths in a first direction in which the frame fixing member and the frame base are aligned when viewed from a second direction substantially perpendicular to the first direction.

7. The electroacoustic transducer according to claim 6, wherein the tapered portion is formed such that the opening portion becomes wider toward a position farthest from the first sheet and the second sheet in the first direction.

8. The electroacoustic transducer according to claim 6, wherein the tapered portion is formed such that the opening portion becomes narrower toward a position farthest from the first sheet and the second sheet in the first direction.

9. An electroacoustic transducer apparatus comprising:

a first electroacoustic transducer having: a first sheet having a curved shape and including a sheet-like piezoelectric material; a second sheet having substantially a same shape as the first sheet and placed on the first sheet in a layered manner, wherein the second sheet is a nonwoven fabric; and a third sheet including a sheet-like piezoelectric material, having substantially a same shape as the first sheet, and placed in a layered manner on an opposite side of the second sheet that is not in contact with the first sheet; and a second electroacoustic transducer having a fourth sheet including a sheet-like piezoelectric material, having a curved shape, and having an area different from an area of the first sheet and of the second sheet.

10. The electroacoustic transducer apparatus according to claim 9, wherein the first electroacoustic transducer or the second electroacoustic transducer is a low-frequency electroacoustic transducer, and a protection adjustment unit is connected to the low-frequency electroacoustic transducer to protect the low-frequency electroacoustic transducer and adjust frequency characteristics.

11. The electroacoustic transducer apparatus according to claim 10, wherein the protection adjustment unit is a protection resistor or a low-pass filter.

12. An electroacoustic transducer apparatus comprising:

a first electroacoustic transducer having: a first sheet having a curved shape and including a sheet-like piezoelectric material; a second sheet having substantially a same shape as the first sheet and placed on the first sheet in a layered manner, wherein the second sheet is a nonwoven fabric; and a third sheet including a sheet-like piezoelectric material, having substantially a same shape as the first sheet, and placed in a layered manner on an opposite side of the second sheet that is not in contact with the first sheet; and a second electroacoustic transducer having: a fourth sheet having a curved shape and including a sheet-like piezoelectric material; and a fifth sheet having substantially a same shape as the fourth sheet and placed on the fourth sheet in a layered manner, the fourth sheet and the fifth sheet having an area different from an area of the first sheet and the second sheet.

* * * * *